US012573550B2

(12) United States Patent \
Parsa Sirat et al.

(10) Patent No.: US 12,573,550 B2 \
(45) Date of Patent: Mar. 10, 2026

(54) SWITCH CURRENT SENSORS

(71) Applicant: The University of North Carolina at Charlotte, Charlotte, NC (US)

(72) Inventors: Ali Parsa Sirat, Charlotte, NC (US); Hossein Niakan, Charlotte, NC (US); Babak Parkhideh, Charlotte, NC (US)

(73) Assignee: THE UNIVERSITY OF NORTH CAROLINA AT CHARLOTTE, Charlotte, NC (US)

( * ) Notice: Subject to any disclaimer, the term of this patent is extended or adjusted under 35 U.S.C. 154(b) by 0 days.

(21) Appl. No.: 18/839,405

(22) PCT Filed: Feb. 16, 2023

(86) PCT No.: PCT/US2023/013253 \
§ 371 (c)(1), \
(2) Date: Aug. 16, 2024

(87) PCT Pub. No.: WO2023/158760 \
PCT Pub. Date: Aug. 24, 2023

(65) Prior Publication Data

US 2025/0111992 A1      Apr. 3, 2025

Related U.S. Application Data

(60) Provisional application No. 63/401,205, filed on Aug. 26, 2022, provisional application No. 63/310,643, filed on Feb. 16, 2022.

(51) Int. Cl. \
*H01F 38/30*          (2006.01) \
*G01R 15/18*          (2006.01) \
(Continued)

(52) U.S. Cl. \
CPC ........... *H01F 38/30* (2013.01); *G01R 15/181* (2013.01); *G01R 19/0046* (2013.01); *G01R 19/16547* (2013.01); *H01F 38/32* (2013.01)

(58) Field of Classification Search \
CPC ....... H01F 38/30; H01F 38/32; G01R 15/181; G01R 19/0046; G01R 19/16547 \
(Continued)

(56) References Cited

U.S. PATENT DOCUMENTS 3,996,513 A * 12/1976 Butler .................... A61B 5/301 \
                                                        336/84 R \
4,878,026 A * 10/1989 Moreau .................. G01R 19/15 \
                                                        324/141 \
(Continued)

OTHER PUBLICATIONS

Translation of RU-2045813-C1 (Year: 1995).* \
(Continued)

*Primary Examiner* — Paresh Patel \
(74) *Attorney, Agent, or Firm* — LOZA & LOZA, LLP; Michael I. Angert

(57) ABSTRACT

A switch current sensor includes a summing circuit, at least one first-type switch current sensor subcircuit and configured to be coupled at a first input to a conductor, and coupled at a first output to the summing circuit, and at least one second-type switch current sensor subcircuit configured to be coupled at a second input to the conductor and coupled at a second output to the summing circuit. The summing circuit is configured to aggregate the first output of the at least one first-type switch current sensor subcircuit and the second output of the at least one second-type switch current sensor subcircuit to obtain a voltage waveform that is proportional to a switch current configured to flow in the conductor, the voltage waveform including a DC component and steady-state AC components of the switch current.

15 Claims, 15 Drawing Sheets

(51) Int. Cl.
  *G01R 19/00*          (2006.01)
  *G01R 19/165*         (2006.01)
  *H01F 38/32*          (2006.01)
(58) Field of Classification Search
  USPC ........................................................ 324/127
  See application file for complete search history.

(56) References Cited

U.S. PATENT DOCUMENTS

| | | | | |
|---|---|---|---|---|
| 5,473,244 | A * | 12/1995 | Libove ................ | G01R 15/142 |
| | | | | 324/130 |
| 6,472,877 | B1 * | 10/2002 | Sands ................ | G01R 31/3272 |
| | | | | 324/423 |
| 11,733,271 | B2 * | 8/2023 | Bartlett ................ | G01R 19/10 |
| | | | | 324/127 |
| 2005/0248430 | A1 * | 11/2005 | Dupraz ................ | G01R 15/181 |
| | | | | 336/200 |
| 2008/0191705 | A1 * | 8/2008 | Bellan .................... | G01R 31/52 |
| | | | | 324/529 |
| 2009/0021237 | A1 * | 1/2009 | Nakajima ............ | G01R 15/183 |
| | | | | 324/76.12 |
| 2014/0253109 | A1 | 9/2014 | Singh et al. | |
| 2018/0017886 | A1 * | 1/2018 | Borenstain ......... | G03G 15/5037 |
| 2019/0064225 | A1 | 2/2019 | Parkhideh et al. | |
| 2020/0249258 | A1 | 8/2020 | Goetz | |
| 2021/0296930 | A1 * | 9/2021 | Chavan ................ | H02J 50/001 |
| 2022/0099706 | A1 * | 3/2022 | Bartlett ................ | G01R 15/181 |

OTHER PUBLICATIONS

International Search Report for PCT Application No. PCT/US23/13253, dated Jun. 14, 2023, 11 pages.

K. S. Kulkarni and D. Divan, "An Edge-Intelligent, Clip-on Rogowski Current Sensor With Wide Dynamic Range," in IEEE Sensors Journal, vol. 21, No. 2, pp. 1059-1071, 15 Jan. 15, 2021, doi: 10.1109/JSEN.2019.2954273.

A. Radun, "An alternative low-cost current-sensing scheme for high-current power electronics circuits," in IEEE Transactions on Industrial Electronics, vol. 42, No. 1, pp. 78-84, Feb. 1995, doi: 10.1109/41.345849.

H. Yoon and Y. Cho, "Application of the Rogowski Coil Current Sensor for Overcurrent Detection and Blocking in Power Conversion Systems," 2019 10th International Conference on Power Electronics and ECCE Asia (ICPE 2019—ECCE Asia), 2019, pp. 1-7, doi: 10.23919/ICPE2019-ECCEAsia42246.2019.8797110.

J. Wang, Z. Shen, R. Burgos and D. Boroyevich, "Design of a high-bandwidth Rogowski current sensor for gate-drive short circuit protection of 1.7 kV SiC MOSFET power modules," 2015 IEEE 3rd Workshop on Wide Bandgap Power Devices and Applications (WiPDA), 2015, pp. 104-107, doi: 10.1109/WIPDA.2015.7369315.

J. Wang, Z. Shen, R. Burgos and D. Boroyevich, "Integrated switch current sensor for short circuit protection and current control of 1.7-KV SiC MOSFET modules," 2016 IEEE Energy Conversion Congress and Exposition (ECCE), 2016, pp. 1-7, doi: 10.1109/ECCE.2016.7855210.

Y. Shi, Z. Xrn, P. C. Loh and F. Blaabjerg, "A Review of Traditional Helical to Recent Miniaturized Printed Circuit Board Rogowski Coils for Power-Electronic Applications," in IEEE Transactions on Power Electronics, vol. 35, No. 11, pp. 12207-12222, Nov. 2020, doi: 10.1109/TPEL.2020.2984055.

G. J. Carlson and F. A. Fisher, "Voltage and Current Sensors for A 1200 kV Gas Insulated Bus," 1979 7th IEEE/PES Transmission and Distribution Conference and Exposition, 1979, pp. 200-207, doi. 10.1109/TDC. 1979.712664.

C. R. McClenahan "A tutorial on Rogowski coil theory and operation". United States. 1987. https://doi.org/10.2172/6379900. https://www.osti.gov/servlets/purl/6379900.

B. Liu et al., "Low-power and high-sensitivity system-on-chip hall effect sensor," 2017 IEEE Sensors, 2017, pp. 1-3, doi: 10.1109/ICSENS.2017.8234272.

N. Troster, B. Dominkovic, J. Wolfle, M. Fischer and J. Roth-Stielow, "Wide bandwidth current probe for power electronics using tunneling magnetoresistance sensors," 2017 IEEE 12th International Conference on Power Electronics and Drive Systems (PEDS), 2017, pp. 35-40, doi: 10.1109/PEDS.2017.8289128.

F. Xie, R. Weiss and R. Weigel, "Giant-Magnetoresistance-Based Galvanically Isolated Voltage and Current Measurements," in IEEE Transactions on Instrumentation and Measurement, vol. 64, No. 8, pp. 2048-2054, Aug. 2015, doi: 10.1109/TIM.2015.2440553.

S. Yin, Y. Wu, M. Dong, J. Lin and H. Li, "Design of Current Transformer for In Situ Switching Current Measurement of Discrete SiC Power Devices," in IEEE Journal of Emerging and Selected Topics in Industrial Electronics, doi: 10.1109/ JESTIE.2022. 3174799.

H. Watanabe, K. Yamamoto, I. Nomura, S. Sumi and T. Wada, "Small-Diameter Rogowski Coil and Integrator for Wide-Band Current Sensor," 2019 11th Asia-Pacific International Conference on Lightning (APL), 2019, pp. 1-6, doi: 10.1109/APL.2019. 8816010.

P. Gu, Q. Chen, H. Li, C. Hu, H. Gong and Y. Jiao, "PCB Rogowski Coils for 300 kA Current Measurement on a Multi-Split Conductor," in IEEE Sensors Journal, vol. 19, No. 16, pp. 6786-6794, 15 Aug. 15, 2019, doi: 10.1109/JSEN.2019.2914730.

J. Wang, S. Mocevic. Y. Xu, C. DiMarino, R. Burgos and D. Boroyevich, "A High-Speed Gate Driver with PCB-Embedded Rogowski Switch.Current Sensor for a 10 KV, 240 A, SiC MOSFET Module," 2018 IEEE Energy Conversion Congress and Exposition (ECCE), 2018, pp. 5489-5494, doi: 10.1109/ECCE.2018.8557631.

X. Zhou et al., "A High-Efficiency High-Power-Density On-Board Low.Voltage DC-DC Converter for Electric Vehicles Application," in IEEE Transactions on Power Electronics, vol. 36 No. 11, pp. 12781-12794, Nov. 2021, doi: 10.1109/TPEL.2021.3076773.

F. Naghavi and H. Toliyat. "A Soft-Switching Single-Stage AC-DC Converter," 2022 IEEE Texas Power and Energy Conference (TPEC), 2022. pp. 1-6.

H. Heydari-Doostabad, S. H. Hosseini. R. Ghazi and T. O'Donnell, "Pseudo DC-Link EV Home Charger with a High Semiconductor Device Utilization Factor," in IEEE Transactions on Industrial Electronics, vol. 69, No. 3, pp. 2459-2469, Mar. 2022, doi: 10.1109/ TJE.2021.3065623.

S. H Hosseini, R. Ghazi, and H. Heydari-Doostabad, "An Extendable Quadratic Bidirectional DC-DC Converter for V2G and G2V Applications," in IEEE Transactions on Industrial Electronics, vol. 68, No. 6, pp. 4859-4869, Jun. 2021. doi: 10.1109/TIE.2020. 2992967.

Abadifard, P. Ghavidel, S. H. Hosseini and M. Farhadi, "Non-isolated Single-Switch Zeta Based High-Step up DC-DC Converter with Coupled Inductor," 2021 31st Australasian Universities Power Engineering Conference (AUPEC), 2021, pp. 1-6, doi: 10.1109/ AUPEC52110.202 1.9597786.

S. H. Hosseini, M. Farhadi and R. Ghazi, "A Common Ground Transformer-less High Gain DC-DC Buck-Boost Converter," 2021 12th Power Electronics, Drive Systems, and Technologies Conference (PEDSTC), 2021, pp. 1-6. doi: 10.1109/PEDSTC52094.2021. 9405964.

J. Guo et al., "A Comprehensive Analysis for High-Power Density High Efficiency 60 KW Interleaved Boost Converter Design for Electrified Powertrains," IEEE Transaction on Vehicular Technology, vol. 69, No. 7, pp. 7131-7145, Jul. 2020, doi: 10.1109/TVT. 2020.2991395.

S. Farzamkia, A. Khoshkbar-Sadigh, H. Iman-Eini, and S. H. Hosseini, "A Flexible Step-up Modular Multilevel Converter for High-Power Drive Application," 2020 IEEE Transportation Electrification Conference & Expo (ITEC). 2020, pp. 314-319. doi: 10.1109/ITEC48692.2020.9161514.

M. Eydi, M. A. Salahmanesh, S. H. Hosseini and R. Ghazi, "A Novel Structure for 15-Level Inverter Based on CHB and SCMLI Topologies," 2020 11th Power Electronics, Drive Systems, and Technologies Conference (PEDSTC), 2020, pp. 1-6, doi: 10.1109. PEDSTC49159.2020.9088410.

F. Naghavi and H. Toliyat, "Grid-connected Soft Switching Partial Resonance Inverter for Distributed Generation," 2022 IEEE International Symposium on Industrial Electronics (ISIE), 2022, pp. 1-6.

(56)         References Cited

OTHER PUBLICATIONS

H. Niakan and B. Parkhideh, "Implementation and Characterization of Point Field Detectors for Current Mismatch Measurements in Paralleled GaN HEMTs," 2019 IEEE 7th Workshop on Wide Bandgap Power Devices and Applications (WIPDA), 2019, pp. 310-313, doi: 10.1109/WiPDA46397.2019.8998952.

H. Niakan, A. P. Sirat and B. Parkhideh, "Current Distribution Monitoring of Paralleled GaN HEMTs," 2020 IEEE Energy Conversion Congress and Exposition (ECCE), 2020, pp. 2865-2870, doi: 10.1109/ECCE44975.2020.9235770.

S. H. Hosseini, R. Ghazi, S. Farzamkia and M. Bahari, "A Novel High Gain Extendable DC-DC Bidirectional Boost- Buck Converter," 2020 11th Power Electronics, Drive Systems, and Technologies Conference (PEDSTC), 2020, pp. 1-6, doi: 10.1109/PEDSTC49159.2020.9088370.

J. A. Lee, S. Arm, D. H. Sim, and B. K. Lee, "Design Guideline and Practical Solution of PCB-type Rogowski Current Sensor for SiC MOSFET Short-Circuit Protection Based on Frequency Analysis," 2022 IEEE Applied Power Electronics Conference and Exposition (APEC), 2022, pp. 1352-1357. doi: 10.1109/APEC43599.2022. 9773781.

W. Limcharoen and p. Yutthagowith. "Rogowski coil with an active integrator for measurement of switching impulse current," 2013 10th International Conference on Electrical Engineering/ Electronics, Computer, Telecommunications, and Information Technology, 2013, pp. 1-4, doi: 10.1109/ECT1Con.2013.6559578.

S. M Kim, R Burgos, .J. Seo, and T. Kwon, "Design of Switching Current Sensor for Three-Phase SiC Inverter," 2021 IEEE Applied Power Electronics Conference and Exposition (APEC), 2021, pp. 2139-2146, doi: 10.1109/APEC42165.2021.9487414.

S. Mocevic et al., "Comparison and Discussion on Short-circuit Protections for Silicon-Carbide MOSFET Modules: Desaturation Versus Rogowski Switch-Current Sensor," in IEEE Transactions on Industry Applications. vol. 56, No. 3, pp. 2880-2893, May-Jun. 2020, doi: 10.1109/TIA.2020.2972816.

O. Poncelas, .J. A. Rosero, .J. Cusido, J. A. Ortega and L. Romeral, "Motor Fault Detection Using a Rogowski Sensor Without an Integrator," in IEEE Transactions on Industrial Electronics. vol. 56, No. 10, pp. 4062-4070, Oct. 2009, doi:10.1109/TIE.2009.2025715.

F. Naghavi, S Sheshaprasad, M. Gardner. A. Meduri, H. Kang and H. Toliyat, "Permanent Magnet Linear Generator Design for Surface Riding Wave Energy Converters," 2021 IEEE Energy Conversion Congress and Exposition (ECCE), 2021, pp. 4369-4375, doi: 10.1109/ECCE47101.2021.9595591.

Moreno, M.V.R., Robles, G., Albamcin, R. et al. Study on the self-integration of a Rogowski coil used in the measurement of partial discharges pulses. Electr Eng 99, 817-826 (2017).

Z. Zhou, Z. Xin, Q. Liu, and C. Li, "A Differential Compensated Air Coil Current Sensor for Switching Current Measurement of Power Devices," in IEEE Transactions on Industrial Electronics, 2022. doi: 10.1109/TIE.2022.3181368.

M. H. Samimi, A Mahari, M. A Farahnakian and H. Mohseni, "The Rogowski Coil Principles and Applications: A Review," in IEEE Sensors Journal, vol. 15, No. 2, pp. 651-658, Feb. 2015, doi: 10.1109/JSEN.2014.2362940.

L. Ming, Z. Xin, C. Yin, M. Chen and P. C. Loh, "Integrator Design of the Rogowski Current Sensor for Detecting Fast Switch Current of SiC Devices," 2019 IEEE Energy Conversion Congress and Exposition (ECCE), 2019. pp. 4551-4557, doi: 10.1109/ECCE.2019. 8911874.

W. Zhang, S. B. Sohid, F Wang, H. Cui, and B. Holzinger, "High-Bandwidth Combinational Rogowski Coil for SiC MOSFET Power Module," in IEEE Transactions on Power Electronics, vol. 37, No. 4, pp. 4397-4405, Apr. 2022, doi: 10.1109/TPEL.2021. 3127545.

J. Wang, S. Mocevic, R. Burgos and D. Boroyevich, "High-Scalability Enhanced Gate Drivers for SiC MOSFET Modules With Transient Immunity Beyond 100 V/ns," in IEEE Transactions on Power Electronics, vol. 35, No. 10. pp. 10180-10199, Oct. 2020, doi: 10.1109/TPEL.2020.2980564.

S. Habibi, R. Rahimi, M. Ferdowsi, and p. Shamsi, "A Coupled Inductor-Based Dual-Switch High Step-up DC-DC Converter with Common Ground," IECON 2021 -. 47th Annual Conference of the IEEE Industrial Electronics Society. 2021, pp. 1-6, doi: 10.1109/IECON48115.2021.9589101.

M. L. Alghaythi, R. M. O'Connell, N. E. Islam. M. M. S. Khan, and J. M. Guerrero, "A High Step-Up Interleaved DC-DC Converter With Voltage Multiplier and Coupled Inductors for Renewable Energy Systems," in IEEE Access, vol. 8. pp. 123165-123174, 2020. doi: 10.1109/ACCESS.2020.3007137.

Habibi, S., Rahimi, R., Ferdowsi, M. arid Shamsi, P., 2021, "DC Bus Voltage Selection for a Grid-Connected Low-Voltage DC Residential Nanogrid Using Real Data with Modified Load Profiles," Energies' 14(21), p. 7001.

* cited by examiner

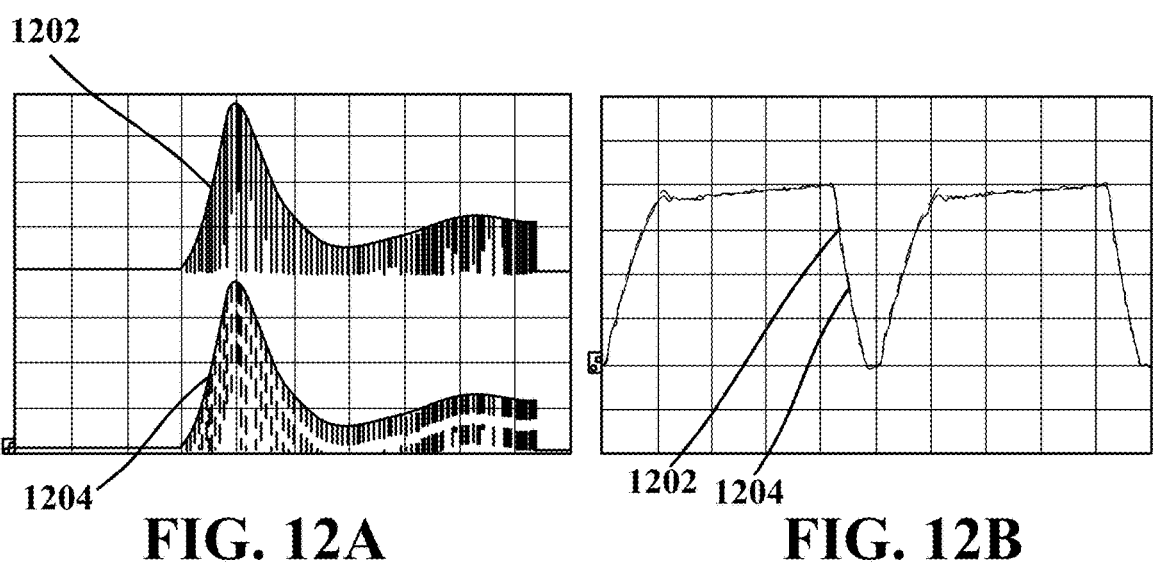
FIG. 12A
FIG. 12B
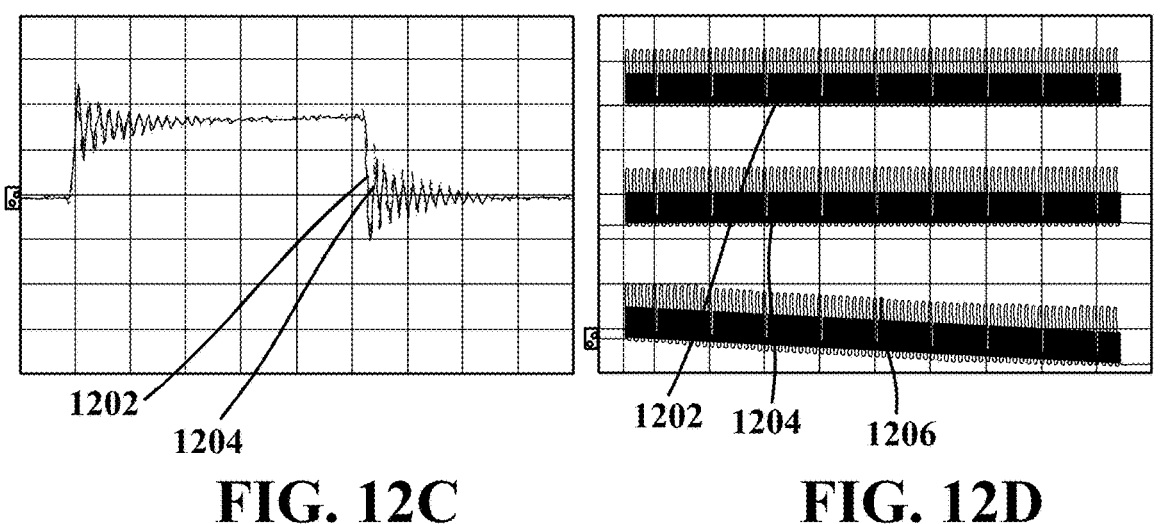
FIG. 12C
FIG. 12D
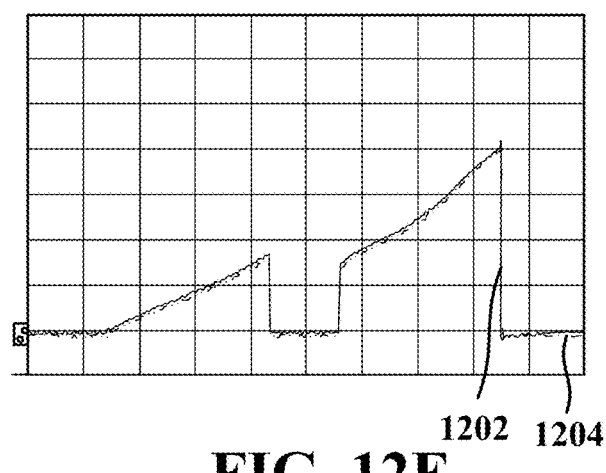
FIG. 12E

SWITCH CURRENT SENSORS

CROSS-REFERENCE TO RELATED APPLICATIONS

This application is the United States national stage entry of PCT patent application number PCT/US23/13253, filed on Feb. 16, 2023 and claims priority to and the benefit of U.S. provisional patent application No. 63/310,643 entitled "Rogowski-Pair With Little To No Reset Circuit Requirements" filed in the United States Patent and Trademark Office on Feb. 16, 2022 and U.S. provisional patent application No. 63/401,205 entitled "Rogowski-Pair With Little To No Reset Circuit Requirements" filed in the United States Patent and Trademark Office on Aug. 26, 2022, the entire content of each is incorporated by reference herein as if fully set forth below in its entirety and for all applicable purposes.

TECHNICAL FIELD

The technology discussed below relates generally to switch current sensors and, more particularly, to switch current sensors used to measure a current in power electronics devices.

INTRODUCTION

Technology related to switching-type power electronics devices is continually advancing. Improvements provide these power electronics devices with improved efficiency, higher nominal switching frequencies, and smaller size than their predecessors. A trend for high-density power electronics devices has led to a global movement to replace silicon semiconductor-based power switching devices with emerging wide-bandgap (WBG) semiconductor-based power switching devices. The WBG semiconductor-based power switching devices have been shown to have superior characteristics compared to their silicon counterparts, for example, in terms of lower conduction and/or switching loss and higher nominal switching speed (switching frequency) capabilities. By way of example, the lower conduction and/or switching loss of the WBG semiconductor-based power switching devices provides a benefit of reduced heat generation. The higher nominal switching speed of the WBG semiconductor-based power devices helps reduce passive filter sizes, increasing the power density of the power electronics devices.

The development of improved switching-type power electronics devices leads to the development of high-frequency, high-bandwidth, compact, and accurate switch current measurement devices for operation and maintenance. Switch current information (also referred to as switching current information), for example, in the form of real-time measurement data from operating power electronics devices, may be helpful in support of various features, including but not limited to control, protection, monitoring, and prognostic features associated with the power electronics devices. Hence, switch current sensors that monitor the switch current of power electronics devices have been integrated into or employed with, for example, legacy and modern silicon semiconductor-based and WBG semiconductor-based power electronics, respectively.

BRIEF SUMMARY OF SOME EXAMPLES

The following presents a summary of one or more aspects of the present disclosure, in order to provide a basic understanding of such aspects. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

In one example, a switch current sensor is described. In the example, the switch current sensor includes a summing circuit, at least one first-type switch current sensor subcircuit having a first input and a first output and configured to be coupled at the first input to a conductor, and coupled at the first output to the summing circuit. The switch current sensor also includes at least one second-type switch current sensor subcircuit having a second input and a second output and configured to be coupled at the second input to the conductor and coupled at the second output to the summing circuit. In the example, the summing circuit is configured to aggregate the first output of the at least one first-type switch current sensor subcircuit and the second output of the at least one second-type switch current sensor subcircuit to obtain a voltage waveform that is proportional to a switch current configured to flow in the conductor, the voltage waveform including a direct current (DC) component and steady-state alternating current (AC) components of the switch current.

In another example, a switch current sensor is described. The switch current sensor of the second example includes means for obtaining a DC component of at least one first-type switch current sensor subcircuit having a first input and a first output and configured to be coupled at the first input to a conductor, and coupled at the first output to the summing circuit, and means for at least one second-type switch current sensor subcircuit having a second input and a second output and configured to be coupled at the second input to the conductor and coupled at the second output to the summing circuit, and means for means for a summing circuit, where the means for the summing circuit is configured to aggregate the first output of the at least one first-type switch current sensor subcircuit and the second output of the at least one second-type switch current sensor subcircuit to produce a voltage waveform that is proportional to a switch current configured to flow in the conductor, the voltage waveform including a DC component and steady-state AC components of the switch current.

These and other aspects will become more fully understood upon a review of the detailed description, which follows. Other aspects, features, and examples will become apparent to those of ordinary skill in the art upon reviewing the following description of specific exemplary aspects in conjunction with the accompanying figures. While features may be discussed relative to certain examples and figures below, all examples can include one or more of the advantageous features discussed herein. In other words, while one or more examples may be discussed as having certain advantageous features, one or more of such features may also be used in accordance with the various examples discussed herein. Similarly, while examples may be discussed below as device, system, or method examples, it should be understood that such examples can be implemented in various devices, systems, and methods.

BRIEF DESCRIPTION OF THE DRAWINGS

FIGS. 12A, 12B, 12C, 12D, and 12E are respective graphical depiction of oscilloscope displays obtained during testing of a PCB-embedded Rogowski coil switch current sensor circuit, as shown and described in connection with FIG. 11 according to some aspects of the disclosure.

DETAILED DESCRIPTION

Figure 1:
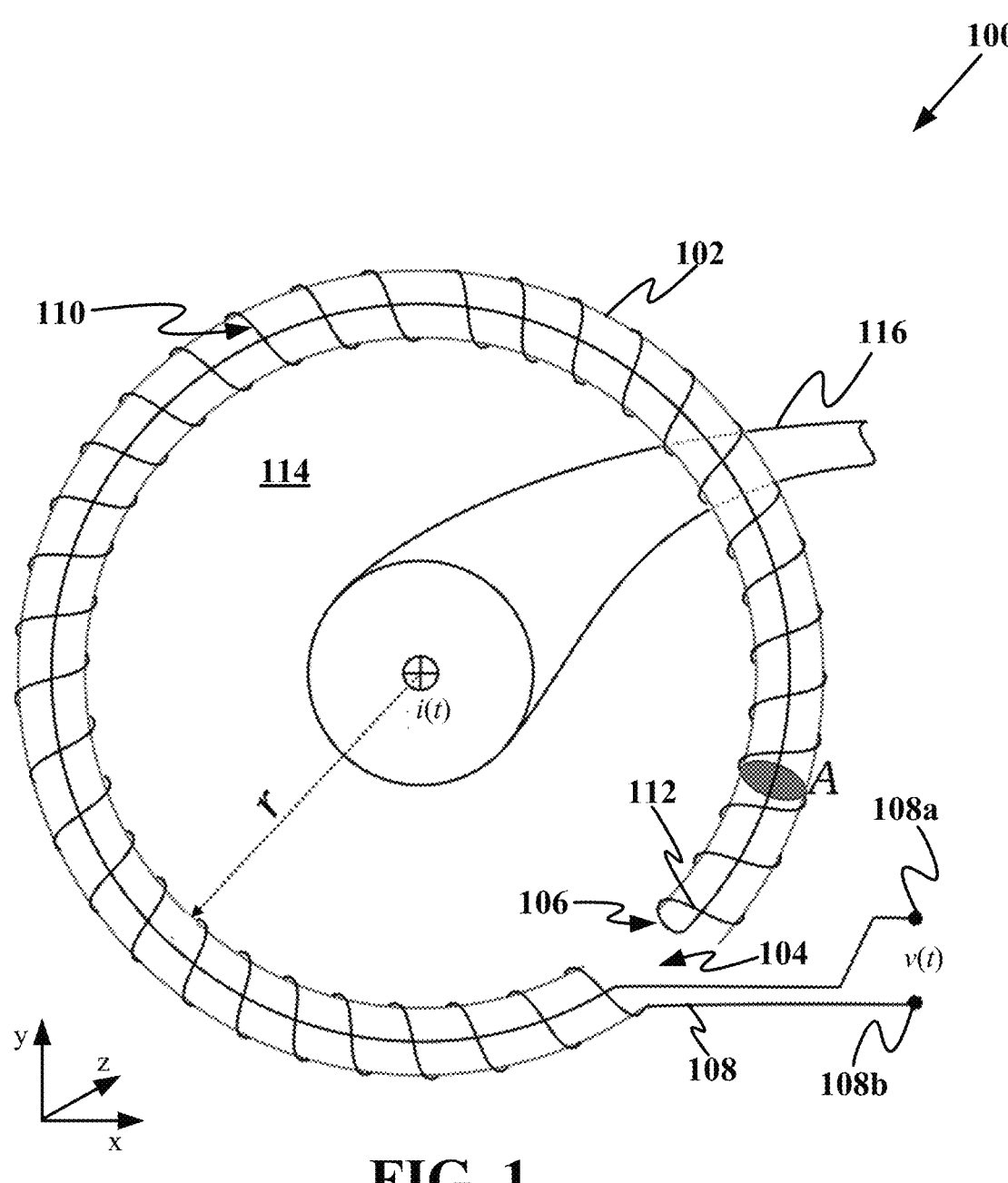
FIG. 1 is a drawing of a prior art toroidal-shaped wire-wrapped coil according to some aspects of the disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some examples, well known structures and components are shown in block diagram form in order to avoid obscuring such concepts.

While aspects and examples are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements.

Described herein are switch current sensors that incorporate air-cored PCB-embedded coils and integrator circuits and operate at high frequencies over wide bandwidths without output droop sometimes associated with the use of integrators despite a lack of any reset circuitry associated with the integrator circuits to combat the output droop. Coils in general have been and continue to be an attractive solution for monitoring electrical current. The coils may be integrated into sensors and protection circuits that may quickly turn off equipment when the sensed current exceeds a threshold, or when the sensed current meets some other criteria configured into the protection equipment. The simplicity and integrability of PCB-embedded coils, such as differential coils (e.g., a Rogowski coil) make them particularly suitable to be used for switch-current measurement within compact high-frequency power converters. However, at higher frequencies droop and offset bias associated with the output voltage of an integrator circuit used in combination with a coil becomes much more challenging to tackle. The droop or output voltage offset bias, has been addressed using auxiliary reset circuits, for example, to cyclically reset the integrator circuits. However, at higher frequencies being utilized by power electronics today and in the future makes it very difficult and impractical to design and integrate cyclic electronic reset circuitry into advanced switch current sensors.

It is noted that the word "coil" is used herein to generally refer to a component of a switch current sensor that couples the switch current sensor to a conductor configured to carry a current; however, nothing herein is intended to limit that component to a literal coil or a component shaped like a coil (e.g., a length of something wound or arranged in a spiral or sequence of rings). The scope of the disclosure encompasses any shape that may be utilized by such a component (i.e., the component of the switch current sensor that couples the switch current sensor to the conductor configured to carry the current). Such shapes include, but are not limited to, coils, segment(s) of coils, circular and polygonal closed lines, segments of circular and polygonal closed lines, helical shapes, spiral shapes, ring-shapes, and linear shapes, all of which may be self-supporting or embedded fully or partially in a substrate (such as, but not limited to, a printed circuit board). The preceding list is exemplary and not limiting.

It is noted that the word "conductor" is used herein to generally refer to a component configured to carry current. The conductor, for example, may be a part of, or included with, a component/apparatus/device/system subject to test by a switch current sensor such as those described herein. As used herein, the word "conductor" is not intended to be limited to a description of a wire or printed circuit board trace; instead, the scope of the disclosure encompasses all examples of conductors used in electronic production and electronic devices, including but not limited to: wires, printed circuit board traces (both surface and inner layers), semiconductors, passive elements, and other circuit components, whether built on chips, semiconductor substrates, power electronic devices, or power modules. The preceding list is exemplary and not limiting.

It is noted that the term "switch current" is used herein to generally refer to a current that can be captured either right at the switch terminals (e.g., of a power electronics device) or any other locations where this information exists. An example of the location could be an input of a buck converter that carries the switch current. In some examples, the switch current sensors exemplified herein may be placed either at the switch terminals or the input terminals.

Described herein are examples of complementary PCB-embedded coil pair switch current sensors that may compensate for the output offset drift of their respective integrator circuits and examples of aggregated PCB-embedded coil sensors that, in addition to compensating for the output offset drift of their respective integrator circuits also provide a DC component voltage associated with the high frequency switch current waveform being sensed. All of the examples provide large detection bandwidth and high slew rate in compact configurations. In some examples, a detection bandwidth that is greater than 50 MHz, or even from several Hz to several GHz may be obtained. The slew rate may be a function of the analog circuitry used in connection with the complementary PCB-embedded coil pair switch current sensors. In some examples the slew rate may be greater than 100 A/µs, in other examples the slew rate may range from about 400 A/µs to about 5,000 A/µs. The complementary PCB-embedded coil pair switch current sensors may be configured to noninvasively couple to a given piece of power electronics (e.g., via a mutual inductance shared by the coils of the switch current sensor and the conductor) or configured to invasively couple to the given piece of power electronics (e.g., via a series connection with the conductor).

Examples of power electronics devices (also referred to as "power electronics" herein) may include, but are not limited to, switched power supplies, and switched power converters. In general, power supplies may provide alternating current (AC) or direct current (DC) outputs and power converters may convert from DC-to-DC, AC-to-DC, DC-AC, or AC-to-AC. For example, power electronics devices may find industrial applicability with uninterruptable power supplies, motor drives, wind turbines, solar systems, and vehicular technologies, to mention a few. In such applications, current control and measurement are vital to the performance and protection of these exemplary energy systems.

The collection of switch current information associated with the operation of power electronics (e.g., a compilation of a switch current dataset associated with operation of a DC-to-DC switched power converter) may be accomplished utilizing invasive (e.g., measuring a voltage drop across a series resistor) or noninvasive (e.g., a magnetic coupling or so-called wireless detection) switch current measurement circuits or devices. Coils and current transformers are two examples of noninvasive current measurement circuits or devices. When coils or transformers are packaged and inserted into a circuit as a sensor, their non-invasive aspect means that they do not touch (electrically) the conductor (e.g., a trace or line) that is being sensed. Instead, electrical coupling between the coil or transformer and the conductor under test is formed via a mutual inductance between the coil or transformer and the conductor. In fact, all magnetic-based current sensing schemes may be noninvasive, due to the mutual inductance feature of magnetic-based current sensors. In some applications, a conductor (carrying a current being sensed) may pass in-line through a center of a coil or may be placed in a plane adjacent to and parallel with a plane bisecting the entirety of a coil. According to some examples, the in-line placement may to concentrate the magnetic field at the measuring point for accuracy purposes.

A current transformer may be any type of coil that is terminated with a resistor. The termination resistor forces the coil integrate itself with a specific gain at a specific frequency range, depending on the value of the termination resistor. Coils may include windings plus a core, and the core in some applications may be air or printed circuit board material (collectively referred to herein as an air-cored coil), in other words, the core need not always be a magnetic core. Current transformers may be air-cored or built with magnetic cores. In some example, such as when a current transformer operates at lower frequencies, the magnetic core may be used to increase the mutual inductance value of the coil of the current transformer. However, due to magnetic core bulkiness and variant temperature nonidealities, for example and without limitation, the magnetic core may be removed and an air or PCB core, similar to those described herein, may be used. While magnetic cores saturate at increased frequency or voltage, air-cored coils and current transformers have no saturation limit. In some examples, air-cored coils may have a higher sensitivity and immunity to noise compared to air-cored transformers. Both air-cored coils and air-cored transformers, when coupled with an active or passive integrator, may cover wide frequency ranges (e.g., several Hz to several GHz). Nevertheless, the upper frequency range of a current sensor utilizing a coil or transformer (for magnetic coupling to a conductor carrying a current to be sensed) may be limited due to, for example, coil parasitic inductance and capacitance.

As indicated above, a coil that utilizes an air or PCB core may provide greater flexibility compared to a coil that uses a ferrous core. The flexibility may be realized in terms of, for example, an enhanced ability to design compact switching current sensors that may be readily integrated into a housing of a power electronics device and utilized for high frequency (e.g., in the range of hundreds of kilohertz to several megahertz).

One example of a coil is a differential coil (e.g., a Rogowski coil). The differential coil may be configured as a toroidal-shaped wire-wrapped device. However, in terms of form factor, differential coils are not limited to toroidal-shaped wire-wrapped devices. For example, a planar differential coil, formed using printed circuit board techniques, may provide benefits including, but not limited to, compactness, flexibility, maximization of the number of turns per coil per unit area of available space on a circuit board, and reduced cost when compared to, for example, a coil of comparable characteristics formed of physical wire wrapped onto a plastic tube that is curved into an overall toroidal shape.

FIG. 1 is a drawing of a prior art toroidal-shaped wire-wrapped Rogowski coil 100 according to some aspects of the disclosure. FIG. 1 is provided for illustrative and non-limiting purposes in connection with a brief explanation of the electrical characteristics of the Rogowski coil 100. It is noted that the toroidal shape 102 does not form a completely closed toroid; instead, a relatively small portion of the toroidal shape 102, between a first end 104 and a second end 106, is omitted. Accordingly, the toroidal shape 102 may be referred to as a segment.

In the Rogowski coil 100 of FIG. 1, beginning at the first end 104 of the segment of the toroidal shape 102, a wire 108 having a first terminal end 108a and a second terminal end 108b is looped around the segment of the toroidal shape 102 to establish a plurality of loops 110 along a length of the segment of the toroidal shape 102. At the second end 106 of the segment, a final one 112 of the plurality of loops 110 is folded into an interior space of the plurality of loops 110. The interior space of the plurality of loops 110 may be defined by inward facing surfaces of the wire 108 at each of the plurality of loops 110. The second terminal end 108*b* of the wire 108 is threaded back, through the interior space of the plurality of loops 110, toward the first end 104 of the segment. The second terminal end 108*b* exits the interior space of the plurality of loops 110 adjacent to the first terminal end 108*a* of the wire 108. The first terminal end 108*a* and the second terminal end 108*b* of the wire 108 form respective terminals (or nodes) of the Rogowski coil 100. In some examples, the material used to form the toroidal shape 102 may be a hollow plastic tube (not shown to avoid cluttering the drawing).

As illustrated, the core 114 of the Rogowski coil 100 is a void defined by the center-facing surfaces of the plurality of loops 110 of the wire 108 (e.g., defined by the minor radios, r, of the toroidal shape 102. As depicted in the example of FIG. 1, the core 114 is filled with air; accordingly, the Rogowski coil 100 of FIG. 1 may be referred to as an air-cored Rogowski coil 100.

A conductor 116 (exemplified for illustrative and non-limiting purposes by a wire) is depicted as passing through the air core of the Rogowski coil 100 of FIG. 1. The conductor 116 carries a current, i(t). In this example, the current is a direct current (DC) current that flows in one direction and may be referred to as a unidirectional current. In other examples, the current may be an alternating current (AC) and may be referred to as a bidirectional current.

The DC current (i(t)) in the example of FIG. 1 may change in amplitude (for example, when the DC current is being switched on and off in association with the operation of a DC-DC power converter), or it may remain at a constant value (e.g., it is not being switched on and off). In the former case (i.e., the current is changing as a function of time by being switched on and off) the changing current flowing through the conductor 116 causes a voltage to be present across the terminals of the Rogowski coil 100 (i.e., across the first terminal end 108*a* and second terminal end 108*b*). This voltage (the output voltage of the Rogowski coil 100) likewise changes as a function of time and may be given as:

$$v(t) = \frac{-AN\mu_0}{l} \frac{di(t)}{dt} \tag{1}$$

where:

A=$\pi r^2$ is the area of one small loop of the plurality of loops 110,

N is the number of turns, l=$2\pi R$ is the length of the winding (the circumference of the toroid), i(t) is the AC current flowing in the conductor 116 passing through the core 114 in the center of the toroidal shape 102, $$\frac{di(t)}{dt}$$

is the rate of change of the current threading the loop, $\mu_0$ is the magnetic constant, R is the major radius of the toroidal shape 102, and r is the minor radius of the toroidal shape 102.

In the example of FIG. 1, the conductor 116 is illustrated as passing through the center of the core 114 of the Rogowski coil 100 along a z-axis perpendicular to the x-y plane of the Rogowski coil 100. However, this configuration is shown for ease of illustration and is non-limiting. For example, as in a case of a planar Rogowski coil, the conductor 116 could lie in a plane parallel to and adjacent to the x-y plane occupied by the Rogowski coil 100. Moreover, the conductor 116 is not limited to a metallic wire (i.e., a conductor in the form of a right circular cylinder). As used herein, the term conductor 116 may include materials of any shape (or form factor) that carry current, including, for example, and without limitation, metallic wire, printed circuit board (PCB) traces (on a surface layer and/or on an interior layer), and semiconductor dies carrying current.

The output voltage, v(t), of the Rogowski coil 100 is not a direct measurement of the current, i(t), flowing through the conductor 116. Instead, the output voltage, v(t), is a measure of the changing magnetic flux associated with the changing current, i(t), flowing through the conductor 116. In other words, and as shown in equation (1), the output voltage, v(t), of the Rogowski coil 100 is proportional to the derivative of the current, d(i)/d(t), flowing through the conductor 116. Because the output voltage of the Rogowski coil 100 is proportional to d(i)/d(t), the Rogowski coil 100 does not provide information concerning the available non-changing DC components of the current, i(t), flowing in/on the conductor 116. This is because the derivative of a constant (e.g., the non-changing DC component of the current i(t) is equal to zero.

To obtain a voltage (e.g., $V_{out}$) that is proportional to the current i(t) flowing through the conductor 116, one may integrate v(t) as shown in equation (2).

$$V_{out} = \int vdt = \frac{-AN\mu_0}{l} I(t) + C_{integration} \tag{2}$$

where: $C_{integration}$ is a constant depending on the preceding instance of integration. $C_{integration}$ may also be considered as a missing DC value that is not detectable in inductive-based sensing methods, due to zero di/dt of the DC component.

Accordingly, when configured as a component of a switch current measuring device, the coil output may be integrated using an integrator system such as an analog integrator that can flatten the rising slope of the coil with the falling slope of the integrator, and therefore flatten the overall response of the current sensor over a desired frequency range.

Active analog integrators, such as those configured with operational amplifiers (op-amps), can theoretically perform the integration depicted in equation 2. However, in practice, op-amp input current and voltage offsets and other nonidealities such as DC response saturation, as well as a lack of DC sensing (when coupled for use with a coil in a switch current sensor application/configuration), could cause the output of the op-amp integrator (and therefor the overall switch current sensor device) to drift toward a non-zero value and exhibit what is referred to herein as droop. Depending on the integrator configuration, as well as the DC value of the measured current, the output drift (alternatively referred to herein as "droop," "output voltage offset bias" or "output drift") may be observed to bias the output signal toward a non-zero value. This bias may be more pronounced in switch current measurements, during which the integrated output of the op-amp is non-zero during an off-state of the device that sources the switch current.

Adding passive feedback elements, such as a parallel feedback resistor, to an op-amp integrator circuit may be one way to reduce the output drift (in comparison to the output drift realized with an op-amp circuit that does not include one or more passive feedback elements). Another way to reduce the output drift may be to reset the op-amp integrator circuit periodically. For example, such a reset may be implemented with an auxiliary reset circuit that includes a switch.

Although periodic reset (complimentary to pulse width modulation (PWM)) may be one way to address the droop or output drift seen with op-amp integrator circuits in switch current measurement applications, in practice, auxiliary reset circuit implementation may be challenging for applications where the nominal switching frequency is in the range of hundreds of kilohertz to several megahertz. For example, megahertz-range switching frequencies imply a switch off-state range of 20 MHz to 2 MHz, or 50 ns to 500 ns, respectively. Op-amp integrator circuits utilize an integration capacitor for feedback, and the integration capacitor discharge time may limit the speed of the auxiliary reset circuit. Thus, designing auxiliary reset circuits in light of a need for the auxiliary reset circuit to have extremely fast reset switch times (e.g., to provide reset action in a small timeframe of 50 ns to 500 ns) may be impractical.

Amongst several existing noninvasive switch current measurement solutions, a solution involving printed circuit board (PCB)-embedded coils (an example of which may be a differential coil, or more specifically a Rogowski coil) may have advantages due to an ability of the PCB-embedded coil to operate at high-frequency (e.g., in the megahertz range) and due to its compact design. At least some of the compact design features result from using a PCB-embedded coil that is air-cored.

Figure 2A:
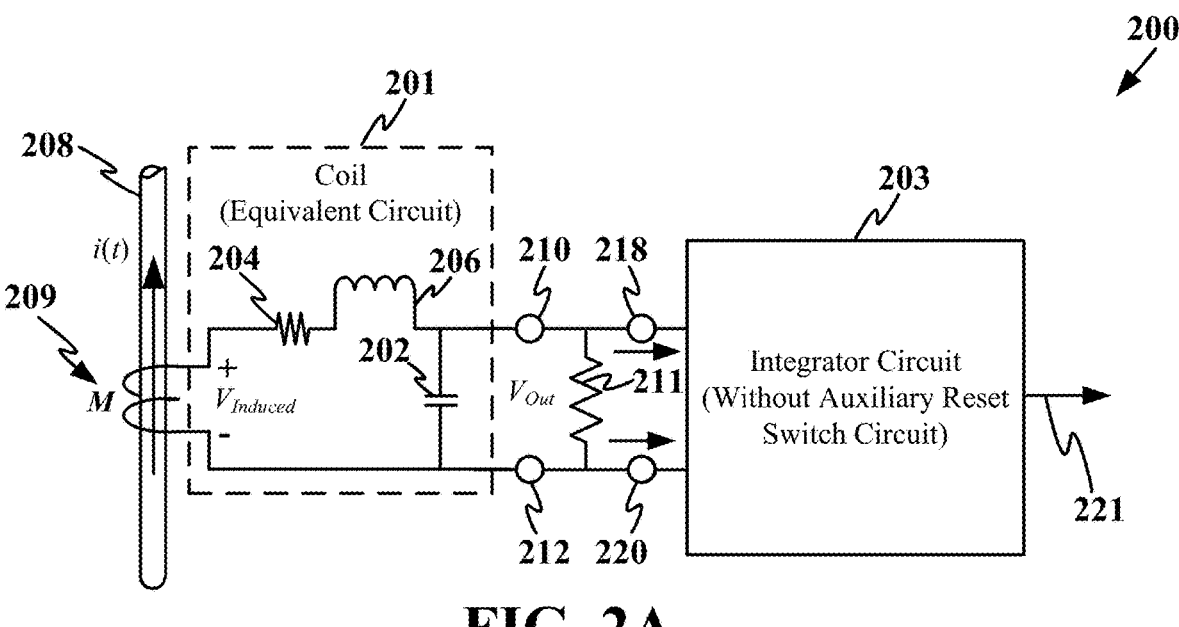
FIG. 2A is a schematic representation of a switch current sensor according to some aspects of the disclosure.
Figure 2B:
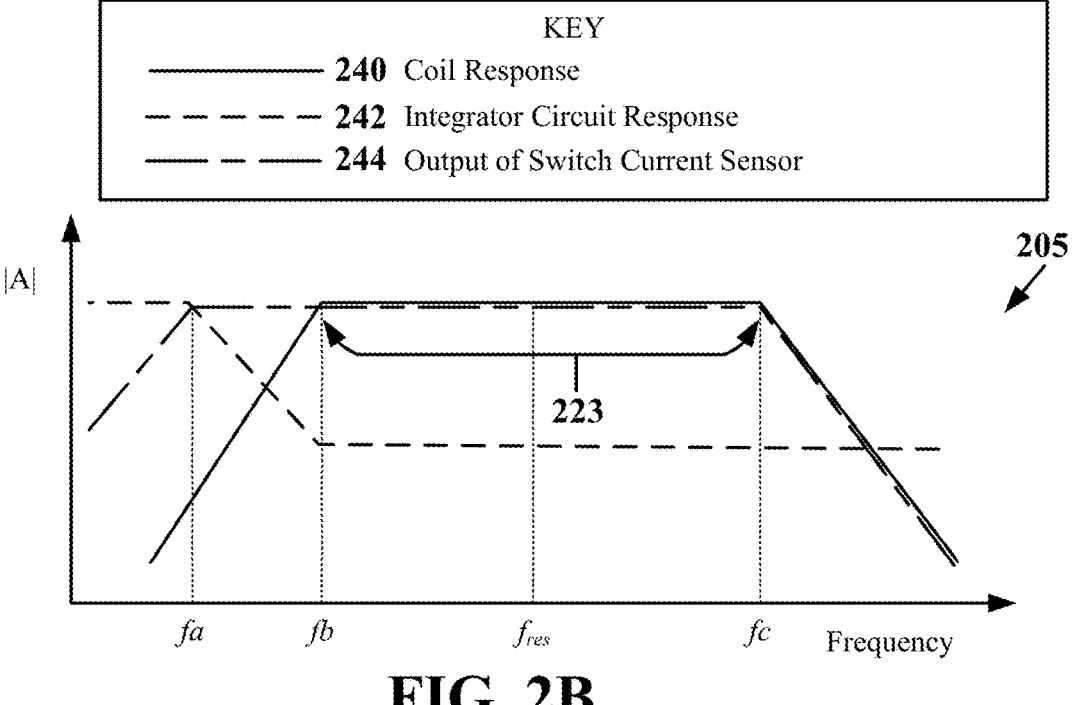
FIG. 2B is a graph illustrating the magnitude responses of various circuitry of FIG. 2A according to some aspects of the disclosure.

FIG. 2A is a schematic representation of a switch current sensor 200 according to some aspects of the disclosure. FIG. 2B is a graph 205 illustrating the magnitude responses of various circuitry of FIG. 2A according to some aspects of the disclosure. As shown in FIG. 2A, the switch current sensor 200 includes PCB-embedded coil 201 (e.g., a PCB-embedded differential coil, a PCB-embedded Rogowski coil). The use of a PCB-embedded coil 201 is for explanatory purposes and is non-limiting. FIG. 2A depicts an equivalent circuit of the PCB-embedded coil 201. An output of the coil 201 may be coupled to a coil termination 211 (e.g., a resistor) (also referred to as $R_{Term}$ herein) and to an integrator circuit 203. The integrator circuit 203 may be an integrating type (1/RC) circuit, such as an active analog op-amp non-inverting integrator. Other types of integrating circuits are within the scope of the disclosure.

In the example of FIG. 2A, the output offset drift of the integrator circuit 203 would tend to cause the output 221 to drift to a non-zero value when the current, i(t) in the conductor 208 is switched off during an off cycle of a power electronics device (not shown) sourcing the current, i(t). A procedure (e.g., a process, a method) may be utilized to tune the output 221 of the integrator circuit 203 to reduce the output drift to a negligible or zero amount during high nominal switching frequency current measurement.

The components that describe the electrical characteristics of the equivalent circuit of the coil 201 are illustrated and described for explanatory and non-limiting purposes. As suggested in FIG. 2, the electrical characteristics (e.g., based on physical geometry of the coil 201) could be modeled according to a parasitic resistor-inductor-capacitor (RLC) element network representative of the coil 201. Using an RLC model, the behavior of the coil 201 may be mapped and estimated and processes to tune the integrator circuit 203 may be defined.

In FIG. 2A, M 209 is a mutual inductance between the coil 201 and the conductor 208 carrying a current i(t). The voltage induced in the coil 201 by a changing magnetic flux associated with the current i(t) is identified as $V_{Induced}$. The capacitor 202 (C in equation (3)) represents a parasitic stray capacitance of the plurality of loops (e.g., similar to the plurality of loops 110 of FIG. 1 but realized in a different form-factor) of the coil 201. As used herein the terms loops and windings may be synonymous. The resistance 204 (e.g., $R_S$ in equation (3)) represents a winding resistance of the coil 201. The mutual inductance 209 (represented by the letter M) (e.g., $L_S$ in equation (3)) represents the self-inductance of the coil 201. By damping the coil output with a coil termination 211 (e.g., $R_{Term}$ as referred to herein), the self-integration frequency bandwidth of the coil 201 may be adjusted. The output voltage, $V_{out}$, of the coil 201 may have a resonant frequency (or double pole) that can be derived from equation (3):

$$f_{res} = \frac{1}{2\pi\sqrt{L_S C}} \tag{3}$$

As depicted in FIG. 2A, this double pole at $f_{res}$ may be shifted and split into two single poles at respective sides of the resonant frequency, $f_{res}$, of the coil 201 by terminating the coil output terminals 210, 212 with the coil termination 211 ($R_{Term}$). In FIG. 2B, the lower frequency pole is identified as fb and the higher frequency pole is identified as fc. Self-integration may occur after the first pole by using the coil termination 211 ($R_{Term}$), and the frequency region between the two poles may be referred to as the self-integration region 223. As shown in FIG. 2B, in the self-integration region 223, the output gain response of coil 201 with the coil termination 211 is almost constant. Tuning of the resistor terminated coil (e.g., the coil 201 with the coil termination 211) allows for bandwidth adjustments and changes in the response curves of the coil 201 with the coil termination 211 according to some aspects of the disclosure.

The transfer function of the resistor terminated coil is described in equation (4).

$$\frac{V_{Out}}{I}(s) = \frac{M R_{Term} s}{L_s R_{Term} C s^2 + (R_s R_{term} C + L_s)s + R_s + R_{Term}} \tag{4}$$

Figures 3A, 3B, 3C, 3D, 3E:
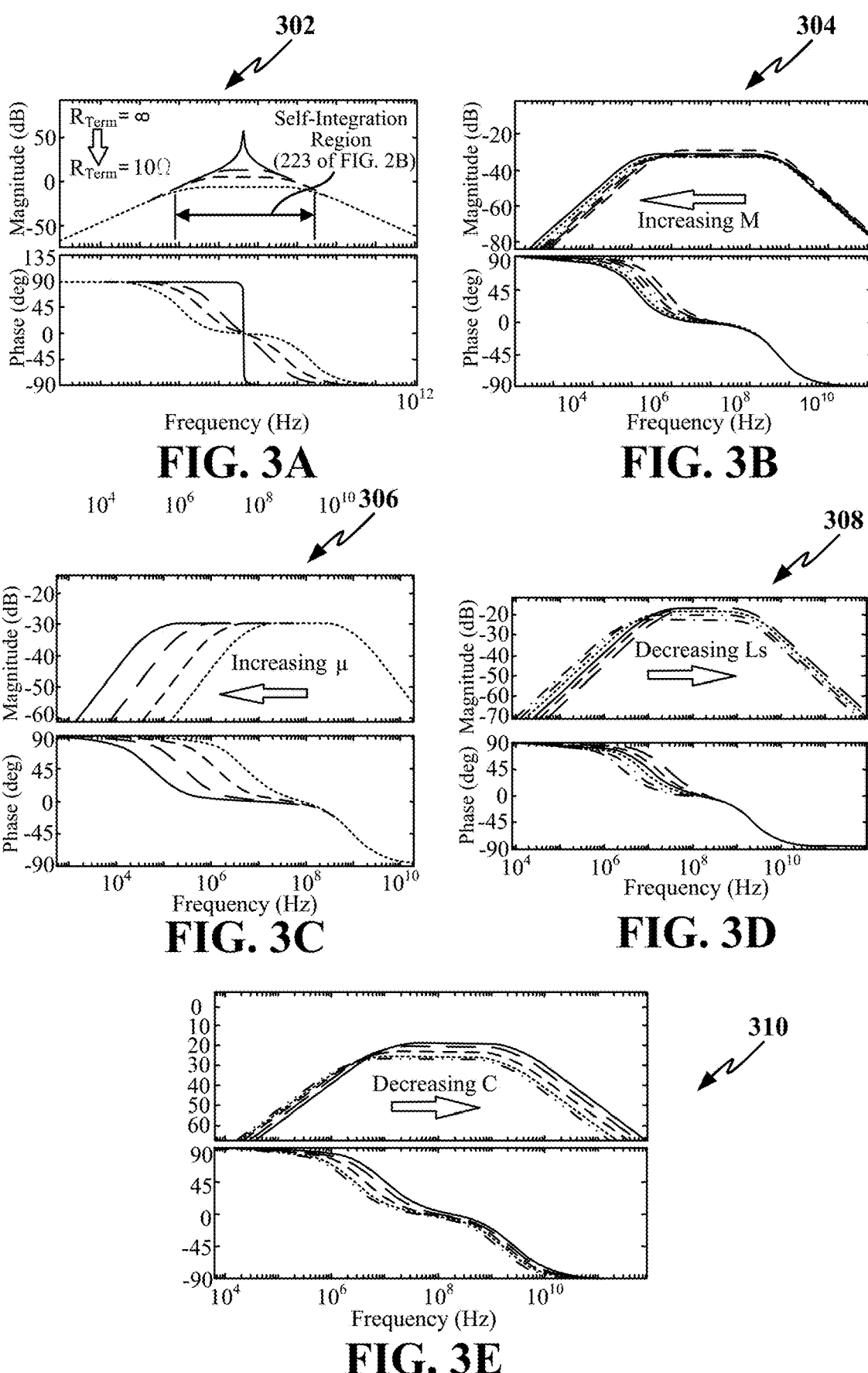
FIGS. 3A-3E are graphs of changes to phase and magnitude responses of a resistor terminated coil of FIG. 2A in response to changes in values parameters associated with the coil according to some aspects of the disclosure.

FIGS. 3A-3E are graphs of changes to phase and magnitude responses of the coil 201 with a coil termination 211 of FIG. 2A in response to changes in values parameters associated with the coil 201 according to some aspects of the disclosure. In each of FIGS. 3A-3E, frequency is shown on a log scale on the horizontal axis and both phase (in degrees) and magnitude (in dB) are shown along the vertical axis. As seen in FIG. 3A, the gain and phase responses 302 of the resistor terminated coil are almost constant in the self-integration region 223.

As seen in FIG. 3B, increasing the mutual inductance (e.g., M 209 of FIG. 2A) may provide a higher gain for lower frequencies. A magnetic core may be applied to increase the mutual inductance. In FIG. 3C, the permeability (u) of the magnetic core was changed and showed increase in gain at lower frequencies as the permeability of the magnetic core was increased.

Although increasing mutual inductance as in FIG. 3B, or permeability as in FIG. 3C, may have the advantage of higher gain at lower frequencies, there are three issues with using a magnetic core. First, the permeability (ur) is a constant number only up to a limited frequency (usually 100 kHz to a few MHz), and it severely drops in higher frequencies. Second, the flux density of a magnetic core reaches saturation after surpassing its magnetic field upper limit (i.e., the maximum current capacity). Additionally, magnetic cores are usually bulky and big, which makes them unsuitable for integrated current sensing applications. The third problem can be related to the core dimensions, while the first and second issues are associated with the core composition.

PCB coils having air core may overcome the three obstacles of the magnetic cores. However, the small magnetic permeability of air ($\mu_o$) cannot represent a significant mutual inductance for a better low-band gain of the coil in low and medium frequency spans (usually up to a few MHz). A possible remedy to increase the lower-band frequency gain could be the integration of the differentiating frequency region using an integrator circuit (such as the integrator circuit 203 as shown and described in connection with FIG. 2A).

Integration types may be classified according to poles and can be broadly divided into external integrators, which perform integration before the first pole (e.g., fb of FIG. 2B) and self-integration integrators, which perform integration between the two poles (as in the self-integration region 223, between the lower pole fb and the upper pole fc as shown and described in connection with FIG. 2B). Of the external integrators, there may be passive (e.g., utilizing RC components) and active versions. There may be two versions of the active versions as well; namely digital, and analog (e.g., where the (op-amp) integrator circuit 203 as shown and described in connection with FIG. 2A is an active analog integrator device).

An external integrator (e.g., integrator circuit 203 of FIG. 2A) may be used to integrate the rising slope shown in FIG. 2B, up to just before the first pole, fb. An example of a practical passive integrator is an RC lowpass filter. However, a large capacitor (or a large time constant) may be needed to achieve enough gain in medium frequencies, assuming a reasonable size air-core coil is used. For example, a passive integrator (e.g., a lowpass RC filter) having values of capacitors that are not higher than 100-200 μF may be unable to obtain a gain as large as that obtained using an op-amp integrator. Accordingly, use of an active integrator may be more suitable for a switch current sensing application in connection with, for example, power electronics devices.

Among active integrators, digital ones require several processing circuits, which adds to complexity, cost, and propagation delay to the overall system. Moreover, digital integrators may not be appropriate to reproduce very fast transients. Analog integrators may be more favorable regarding complexity, cost, and reproduction of fast transients and overall use in connection with precise and ultrafast current sensing applications. Furthermore, an op-amp integrator may be modified to perform in specific frequency ranges with a desirable gain margin.

Figure 4:
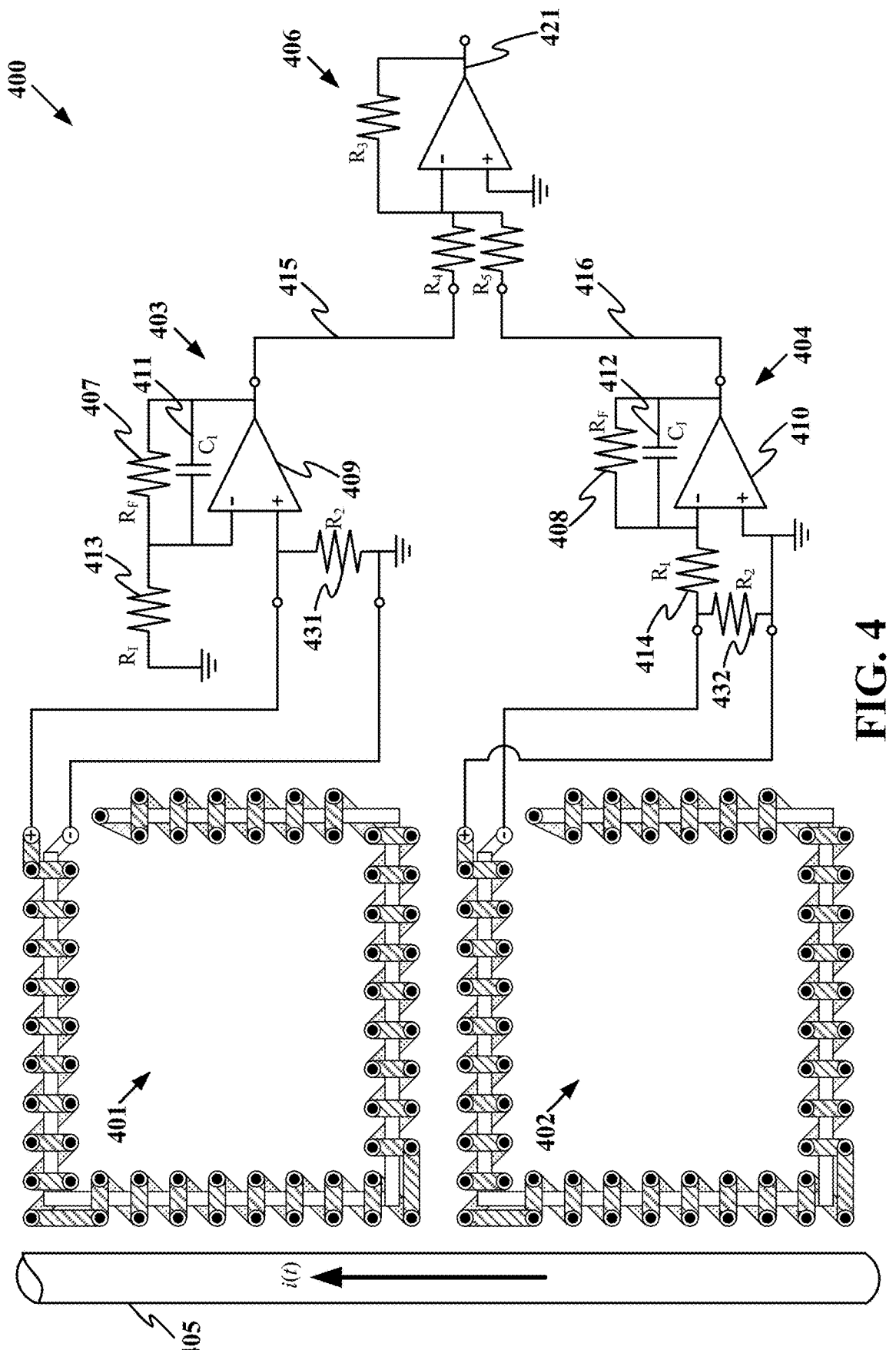
FIG. 4 is a schematic representation of a complementary PCB-embedded coil pair sensor according to some aspects of the disclosure.

FIG. 4 is a schematic representation of a PCB-embedded dual coil switch current sensor (hereinafter referred to as a complementary coil pair switch current sensor 400) according to some aspects of the disclosure. Such a complementary coil pair switch current sensor 400 may remove the output drift, or droop, associated with the use of integrator circuits, while maintaining an ability to operate at high frequencies (e.g., in the range of hundreds of kilohertz to several megahertz).

As illustrated in FIG. 4, the complementary coil pair switch current sensor 400 includes a first PCB-embedded coil 401 and a second PCB-embedded coil 402. This pair of PCB-embedded coils may form an identical pair of PCB-embedded coils with reverse polarities. Each of the first PCB-embedded coil 401 and the second PCB-embedded coil 402 may sense a current i(t) flowing through the conductor 405 according to some aspects of the disclosure.

An output of the first PCB-embedded coil 401 may be coupled to a first coil termination 431 and a first integrator circuit 403 and an output of the second PCB-embedded coil 402 may be coupled to a second coil termination 432 and a second integrator circuit 404. The first integrator circuit 403 may be a non-inverting integrator (e.g., an op-amp non-inverting integrating type (1/s, 1/RC) circuit) and the second integrator circuit 404 may be an inverting integrator (e.g., an op-amp inverting integrating type (1/s, 1/RC) circuit). The first integrator circuit 403 and the second integrator circuit 404 may be examples of respective means for sensing or measuring the current i(t) flowing through the conductor 405 according to some aspects of the disclosure.

The signal polarity of the output of the first integrator circuit 403 and the signal polarity of the output of the second integrator circuit 404 will have the same polarity because the polarity of the output of the second PCB-embedded coil 402 is 180 degrees out of phase with the output of the first integrator circuit 403 and the output of the second PCB-embedded coil 402 is applied to the second integrator circuit 404, which is an inverting integrator circuit. However, the output offset drift of the first integrator circuit 403 and the second integrator circuit 404 may be in opposite directions for each coil respectively.

The aggregating circuit 406 (e.g., an op-amp summing circuit) may combine the outputs of the first integrator circuit 403 and the second integrator circuit 404, which will cancel the opposite output offset drifts of the first integrator circuit 403 and the second integrator circuit 404 at the output 421 of the aggregating circuit 406. The aggregating circuit 406 may provide a means for aggregating, summing, or adding signals (e.g., represented as voltage waveforms) applied to the input of the aggregating circuit 406 to obtain, at the output of the aggregating circuit 406, an aggregated, summed, added representation of the signals. Other configurations, both active and passive, of the aggregating circuit 406 are within the scope of the disclosure. Parameters of the first PCB-embedded coil 401, the first coil termination 431, the first integrator circuit 403, the second PCB-embedded coil 402, the second coil termination 432, and/or the second integrator circuit 404 may be adjusted to tune the outputs of each of the first integrator circuit 403 and the second integrator circuit 404 to obtain an output from the aggregating circuit 406 that may have negligible to no drift for high nominal switching frequency current measurements.

In greater detail, a first feedback resistor 407 ($R_F$) of the first integrator circuit 403 limits an open-loop gain of the first op-amp 409 and a second feedback resistor 408 ($R_F$) of the second integrator circuit 404 limits the open-loop gain the second op-amp 410. Each therefore provides a low-pass magnitude response for its respective op-amp. Moreover, the phase responses of the first integrator circuit 403 and the second integrator circuit 404 are 180 degrees apart. Assuming a switch current with a specific DC component value to be sensed, based on the symmetry between the first integrator circuit 403 and the second integrator circuit 404, the first integrator circuit 403 imparts a positive drift to the first integrator output 415. The positive drift of the first integrator output 415 may be directly related to the integrator phase response, switch current DC value, as well as the first feedback resistor 407 value (gain limiter). On the other hand, because the second integrator circuit 404 is the reverse of the first integrator circuit 403, once the input voltage is integrated in the second integrator circuit 404, the polarity of the signal at the second integrator output 416 has the same polarity as the signal at the first integrator output 415, however, the output offset drift of the second integrator circuit 404 is the negative of the output offset drift of the first integrator circuit 403 in steady state.

Returning to the aspects of the two op-amp-based active analog integrators of FIG. 4, as already noted, the first integrator circuit 403 may be referred to as a non-inverting integrator circuit and the second integrator circuit 404 may be referred to as an inverting integrator circuit. Each integrator circuit may include the first feedback resistor 407, the second feedback resistor 408, an integrating capacitor 411, 412, and an integrating resistor 413, 414 according to some aspects of the disclosure. Depending on the application, one of the two types of integrator circuits may be preferred. For example, the inverting integrator (the second integrator circuit 404) may be more stable due to its negative feedback. However, the non-inverting integrator (the first integrator circuit 403) has no phase change over a wide frequency range. As shown in FIG. 2B, by selecting and overlapping the integrating slope of a given integrator and the differentiating slope of the coil, as well as making adjustments to, for example, the coil termination 211 (e.g., the resistor, $R_{Term}$, of FIG. 2A) of a resistor terminated coil to obtain a large bandwidth corresponding to the self-integration region (e.g., 223, of FIG. 2B), an overall output of the complementary coil pair switch current sensor 400 may be achieved, and with the exception of a DC value, a constant gain over a frequency range from about 1 Hz to about 100 Mz, or about several Hz to about 100 MHz, or from several hundred Hz to about several hundred MHz, for example may be obtained.

Figure 5:
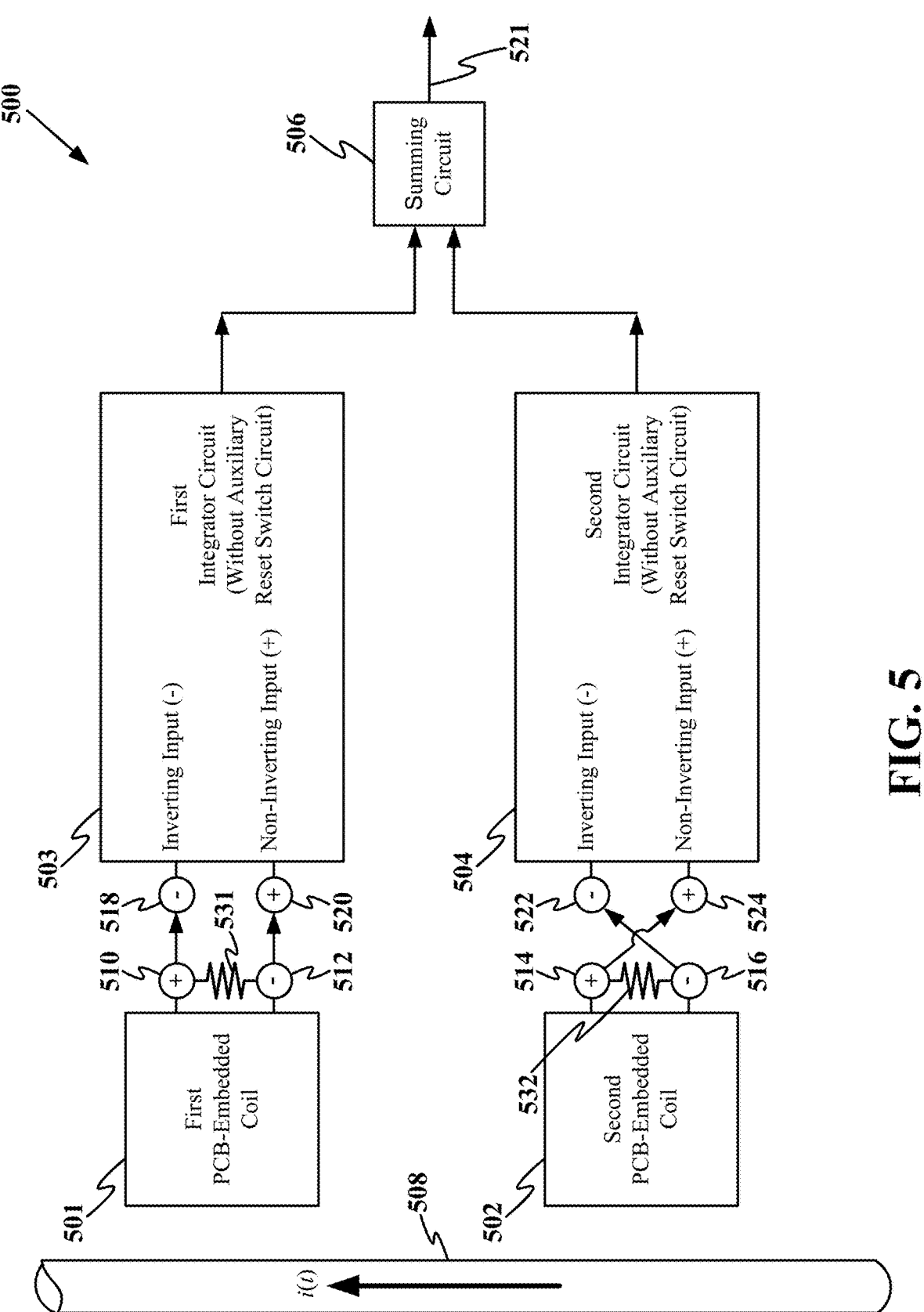
FIG. 5 is a block diagram of a complementary PCB-embedded coil pair sensor according to some aspects of the disclosure.

FIG. 5 is a block diagram of a complementary PCB-embedded coil pair sensor 500 (e.g., a PCB-embedded dual Rogowski coil switch current sensor) according to some aspects of the disclosure. The representative blocks and components may be realized with discrete components or one or more integrated circuits. The complementary PCB-embedded coil pair sensor 500 may be similar to the complementary coil pair switch current sensor 400 as shown and described in connection with FIG. 4. As depicted, the complementary PCB-embedded coil pair sensor 500 includes a first PCB-embedded coil 501 and a second PCB-embedded coil 502. The first PCB-embedded coil 501 is identical to (or substantially similar to) the second PCB-embedded coil 502. In other words, and by way of example, both the first PCB-embedded coil 501 and the second PCB-embedded coil 502 may be fabricated using the same mask works. The first PCB-embedded coil 501 includes a first polarized output having a first positive output terminal 510 and a first negative output terminal 512. The second PCB-embedded coil 502 includes a second polarized output having a second positive output terminal 514 and a second negative output terminal 516. A first coil termination 531 is in parallel with the output terminals of the first PCB-embedded coil 501. A second coil termination 532 is in parallel with the output terminals of the second PCB-embedded coil 502. Each of the first PCB-embedded coil 501 and the second PCB-embedded coil 502 may sense a current i(t) flowing through the conductor 508 according to some aspects of the disclosure.

The complementary PCB-embedded coil pair sensor 500 further includes a first integrator circuit 503 and a second integrator circuit 504. Both the first integrator circuit 503 and the second integrator circuit 504 lack auxiliary reset circuitry and functionality. Aspects of reset switch circuitry were described above and will not be repeated for the sake of brevity. The first integrator circuit 503 includes a first polarized input having a third negative input terminal 518 and a third positive input terminal 520. The second integrator circuit 504 includes a second polarized input having a fourth negative input terminal 522 and a fourth positive input terminal 524. The respective outputs of the first integrator circuit 503 and the second integrator circuit 504 are coupled to the input of a summing circuit 506.

As between the first PCB-embedded coil 501 and the first integrator circuit 503, the first positive output terminal 510 of the first PCB-embedded coil 501 may be electrically coupled to the third negative input terminal 518 (i.e., the inverting input) of the first integrator circuit 503. The first negative output terminal 512 of the first PCB-embedded coil 501 may be electrically coupled to the third positive input terminal 520 (i.e., the non-inverting input) of the first integrator circuit 503.

As between the second PCB-embedded coil 502 and the second integrator circuit 504, the second positive output terminal 514 of the second PCB-embedded coil 502 may be electrically coupled to the fourth positive input terminal 524 (i.e., the non-inverting input) of the second integrator circuit 504. The second negative output terminal 516 of the second PCB-embedded coil 502 may be electrically coupled to the fourth negative input terminal 522 (i.e., the inverting input) of the second integrator circuit 504.

The summing circuit 506 (e.g., an op-amp summing circuit) may combine the outputs of the first integrator circuit 503 and the second integrator circuit 504, which will cancel the opposite output offset drifts of the first integrator circuit 503 and the second integrator circuit 504 at the output 521 of the summing circuit 506. The summing circuit 506 may provide a means for aggregating, summing, or adding signals (e.g., represented as voltage waveforms) applied to the input of the summing circuit 506 to obtain, at the output of the summing circuit 506, an aggregated, summed, added representation of the signals. Other configurations, both active and passive, of the summing circuit 506 are within the scope of the disclosure. Parameters of the first PCB-embedded coil 501, the first coil termination 531, the first integrator circuit 503, the second PCB-embedded coil 502, the second coil termination 532, and/or the second integrator circuit 504 may be adjusted to tune the outputs of each of the first integrator circuit 503 and the second integrator circuit 504 to obtain an output from the summing circuit 506 that may have negligible to no drift for high nominal switching frequency current measurements.

Figure 6:
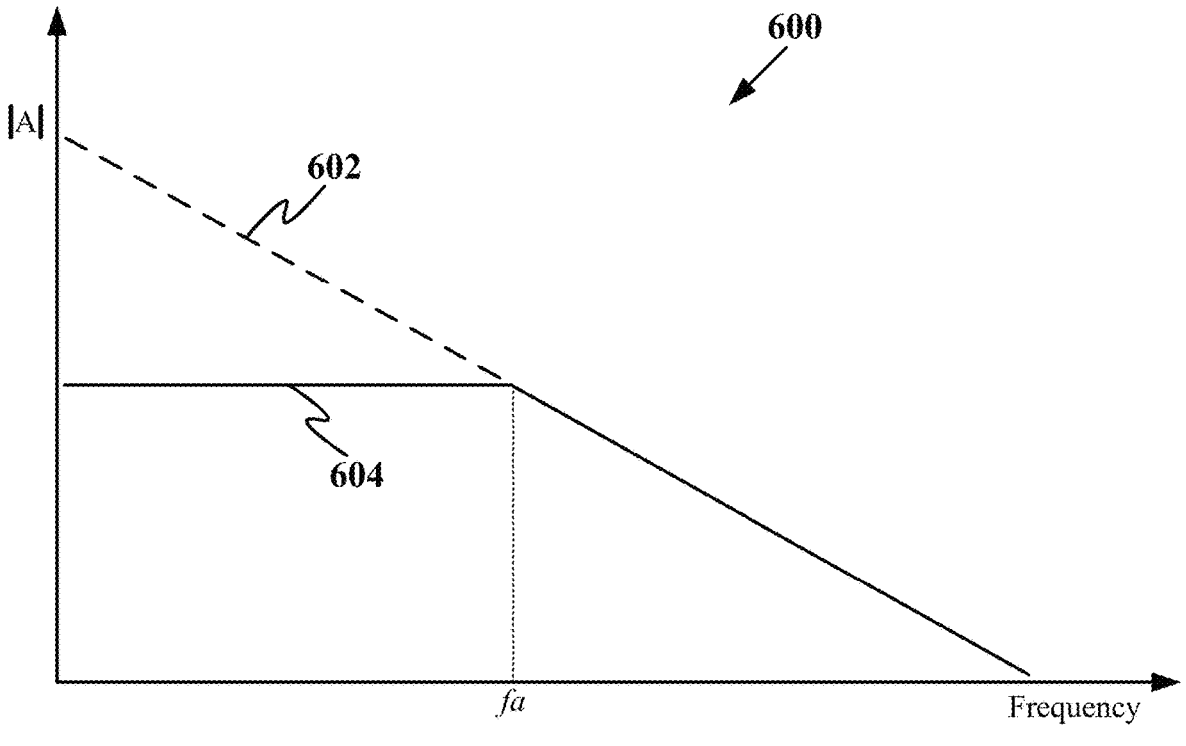
FIG. 6 is a graph showing integrator circuit gain margin according to some aspects of the disclosure.

FIG. 6 is a graph showing integrator circuit gain margin 600 according to some aspects of the disclosure. In FIG. 6, frequency is shown on the horizontal axis and the magnitude of an amplitude is shown on the vertical axis. As illustrated in FIG. 6, an ideal integrator response 602 begins at zero Hertz and continues in a downward sloping line. In contrast, practical linear op-amp integrators may be considered lossy integrators. The integrator response 604 of a practical op-amp integrator starts at above a specific frequency, fa as depicted in FIG. 2B and FIG. 6. In the example of FIG. 6, the value of fa may be between about 100 Hz and about 10 kHz. This may be due to the inclusion of the feedback resistance of $R_f$ that avoids saturation in DC or low frequencies. In other words, a practical coil switch current sensor may have a low frequency band response that starts two or three decades after 1 Hz (due to the lossy integrator present in the practical coil switch current sensor).

The absence of a satisfactory low-band gain (e.g., in comparison to the ideal integrator) for a practical integrator circuit is an issue associated with coil switch current sensors that utilize practical integrator circuits. As described above, the gain of a coil is induced based on electromagnetic induction, which, as described in equation (1) is proportional to the changes of current with respect to time. Consequently, a coil has small gain at lower frequencies, and no response to DC components in steady-state operation. Overall, not including low frequencies and DC causes droop issues in the current waveforms that have DC or low-frequency components such as switch current in power electronics devices. In legacy sensors, and as described above, resetting the integrating capacitor during the off state of the switch is one of the solutions to capture a rough precise waveform of the switch. However, reset circuit implementation and the response time of the switch needed in such reset circuits are among the biggest challenges in integrated power electronics.

Figures 7A, 7B, 7C:
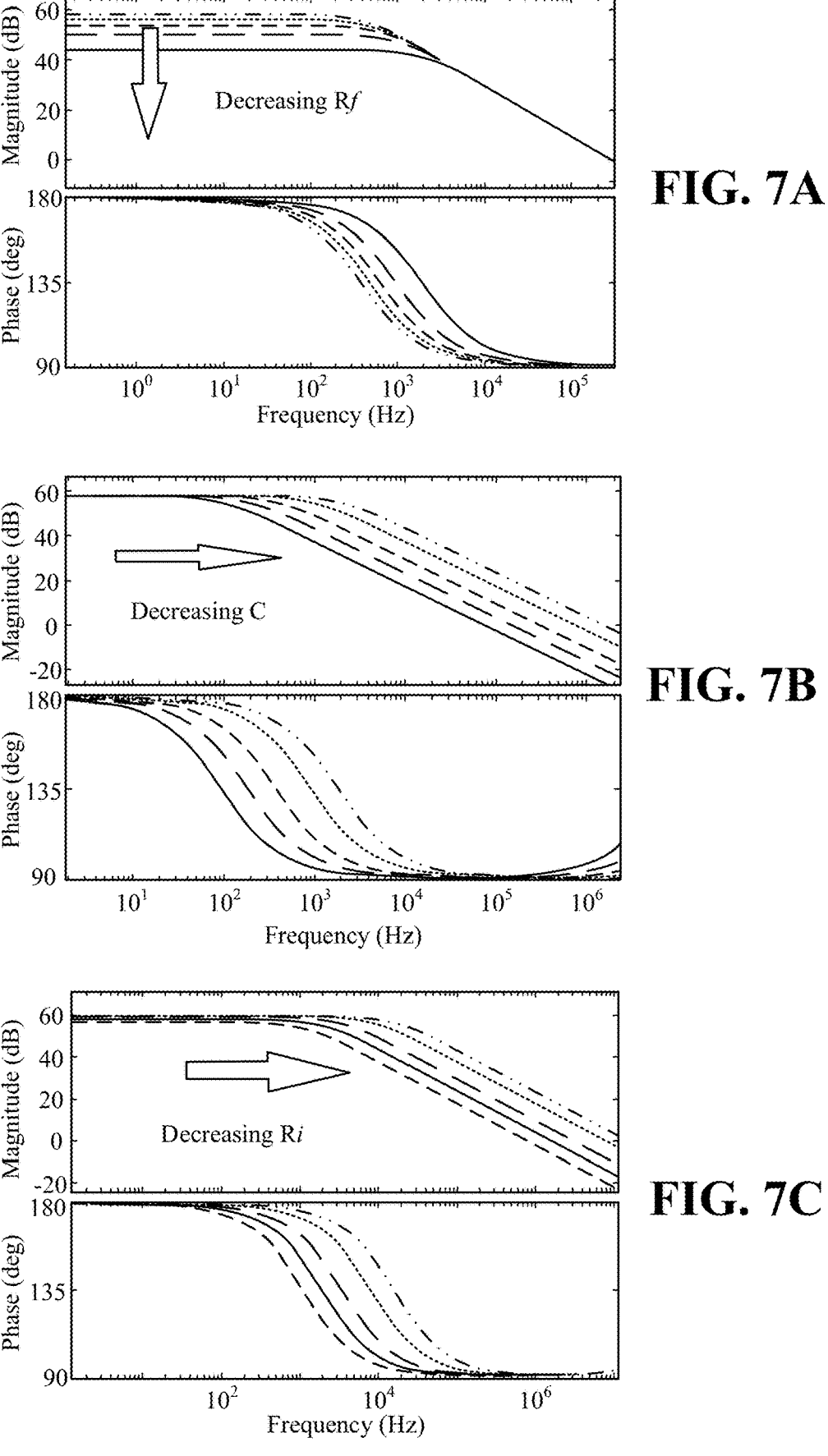
FIGS. 7A-7C illustrate gain and bandwidth changes of an analog integrator circuit as a function of a change in value of a feedback resistor, an integrating capacitor, and an integrating resistor according to some aspects of the disclosure.

FIGS. 7A-7C illustrate gain and bandwidth changes of an analog integrator circuit as a function of a change in value of a feedback resistor (e.g., 407, 408 of FIG. 4), an integrating capacitor (e.g., 411, 412 of FIG. 4), and an integrating resistor (e.g., 413, 414 of FIG. 4) according to some aspects of the disclosure. In each of FIGS. 7A, 7B, and 7C, frequency is shown on a log scale on the horizontal axis and both phase (in degrees) and magnitude (in dB) are shown along the vertical axis. As shown in FIG. 7A, decreasing the value of the feedback resistor may cause the integration to be started from higher frequencies and lower frequencies may be missed As shown in FIG. 7B decreasing the value of the integrating capacitor may cause the integration to be started from higher frequencies and lower frequencies may be missed. As shown in FIG. 7C, decreasing the value of the integrating resistor may cause the integration to be started from higher frequencies and lower frequencies may be missed.

Figure 8:
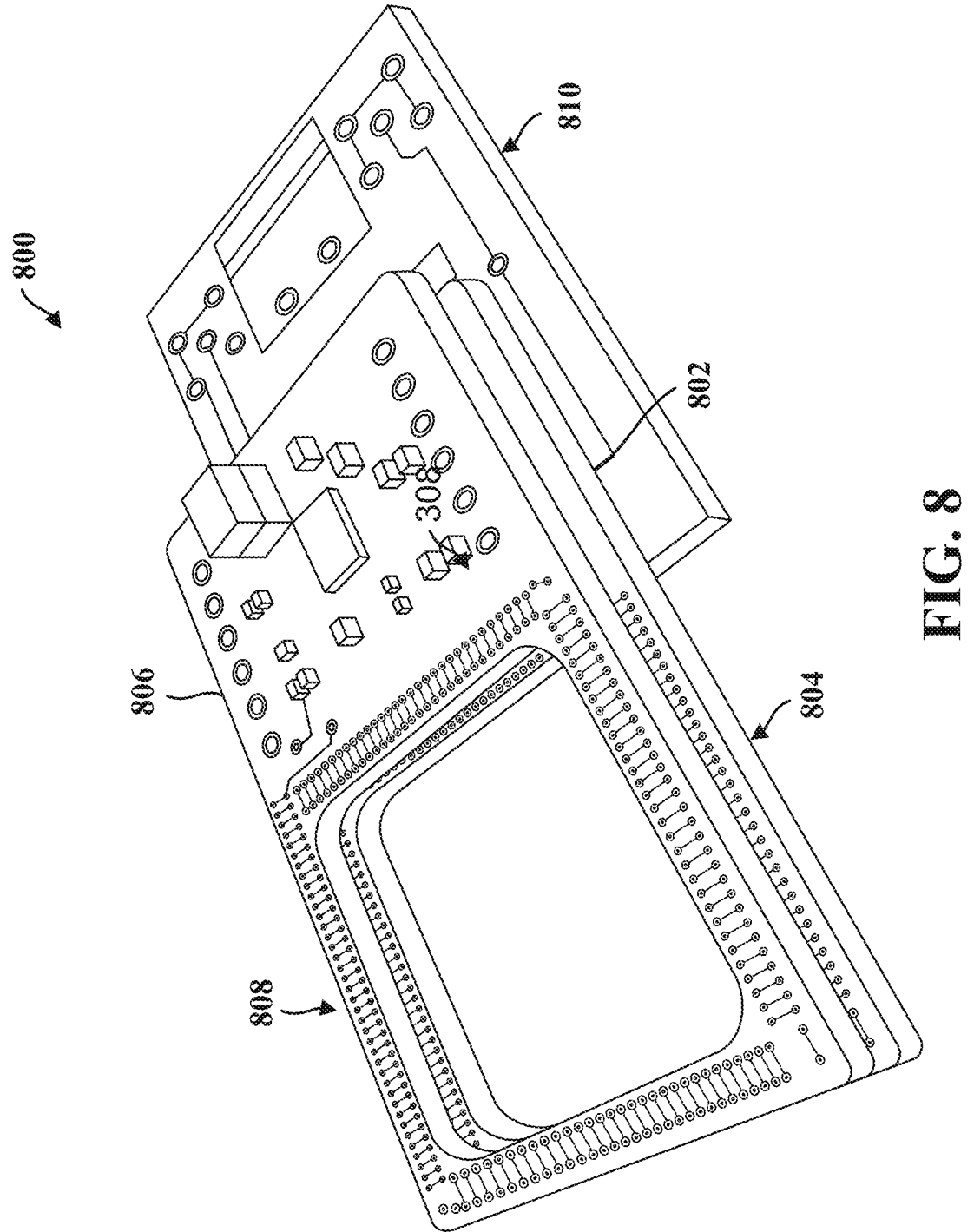
FIG. 8 is an illustration of a complementary PCB-embedded dual coil switch current sensor according to some aspects of the disclosure.

FIG. 8 is an illustration of a complementary PCB-embedded dual Rogowski coil switch current sensor 800 (e.g., where the Rogowski coil is one example of a coil in general, and of a differential coil in particular) according to some aspects of the disclosure. A first coil assembly 802, including a first PCB-embedded Rogowski coil 804, a first termination resistor, and a first integrator circuit were fabricated on a first (lower) PCB. A second coil assembly 806, including a second PCB-embedded Rogowski coil 808, a second termination resistor, and as second integrator circuit were fabricated on a second (upper) PCB. A summing circuit 810 was fabricated on a third PCB. The three PCBs include all of the circuitry and interconnections described in connection with, for example, FIGS. 4 and 5. The PCB-embedded Rogowski coils and associated circuitry were manufactured on FR-4 with characteristics listed in Table 1, In one experiment, the two Rogowski coils were configured according to the parameters of Table 1. Both coils were oriented to have opposite polarities with respect to each other (180 degrees apart). The output of each coil was separately processed through an inverting and a non-inverting integrator, respectively. After gain matching and optimizing each integrator's tuning parameters, the two outputs were aggregated (summed, added) to provide a final sensor output. The final sensor output was found to have negligible to no drift when measuring steady-state switch current waveforms.

The testbed used in connection with the testing of the complementary PCB-embedded dual Rogowski coil switch current sensor 800 included a high-frequency half-bridge that was configured as a boost converter. In order to observe the drift issue, the first PCB-embedded Rogowski coil 804 and the second PCB-embedded Rogowski coil 808 were configured to sense the top switch current waveform during steady-state operation. According to the circuit configurations shown and describe in connection with FIGS. 4 and 5, the output of each coil was integrated using identical high slew-rate op-amps configured as inverting and non-inverting integrators, respectively. Both sensors (where a sensor includes a coil, a termination resistor, an integrator circuit, and ancillary circuitry to power the op-amp) had zero offset shown in their respective outputs while reading no current, after tuning using passive elements, such as resistors and capacitors wherever they are needed for filtering or voltage dividing, as well as respective high-pass filter stages that may be placed at the respective op-amp outputs. The circuit gains as measured at the respective outputs of the complementary PCB-embedded dual Rogowski coil switch current sensor 800 were matched and summed, in order to minimize drift on the final output.

As described above, an op-amp integrator circuit may utilize a parallel resistor and capacitor that are coupled between (e.g., across) an output of the op-amp and an inverting terminal at the input to the op-amp. The resistor may be referred to as a feedback resistor ($R_f$) and the capacitor may be referred to as an integration capacitor (Ci). In legacy switch current sensors that utilize a coil and integrator circuit, an auxiliary reset circuit including a switch was used to reset (i.e., discharge) Ci during an off state of the power electronics by the switch current sensor. In one example, the switch of the auxiliary reset circuit may be placed in parallel with the parallel RACi circuit. As described above, although a coil cannot sense DC compo-

TABLE 1

| | | Rogowski Coil Parameters | | | | |
|---|---|---|---|---|---|---|
| | | | | | Measured RLC characteristics | |
| | Cross- | Average | | | | |
| Coil geometry | section area | hole diameter | Number of turns | Total series R | Series L | Stray C |
| Rectangular | 3 mm by 1.6 mm | 28 mm | 140 | 0.6 Ohms | ≈640 nH | 16 pF | nents, the output of an inverter circuit may tend to droop (return toward a non-zero value) and thus induce error in the measurements.

Legacy switch current sensors used the auxiliary rest circuit (e.g., a cyclic reset circuit including a switch) to reset (i.e., discharge) Ci during an off state of the power electronics. Resetting the integrator circuit (e.g., discharging Ci) may force the integration (performed by the integrator circuit) to start from zero (or the bias point) in each cycle of the power electronics sourcing the current being measured. Although the auxiliary reset circuit may correct the output drift, or droop, of the integrator circuit, the auxiliary reset circuit may utilize external gating signals (e.g., to control the switch of the auxiliary reset circuit). The external gating signals may match the off time of the power electronics to the opening/closing times of the switch in an auxiliary reset circuit. Developing high speed auxiliary reset circuitry that generates or interfaces to the external gating signals, which may be in the range of hundreds of kilohertz to several megahertz has become impractical and difficult. Additionally, the high switching speeds of the auxiliary reset circuitry and the action of the reset switch opening and closing at these high frequencies, may impose noise or electromagnetic interference (EMI) onto the host circuit (i.e., the integrator circuit).

Figure 9:
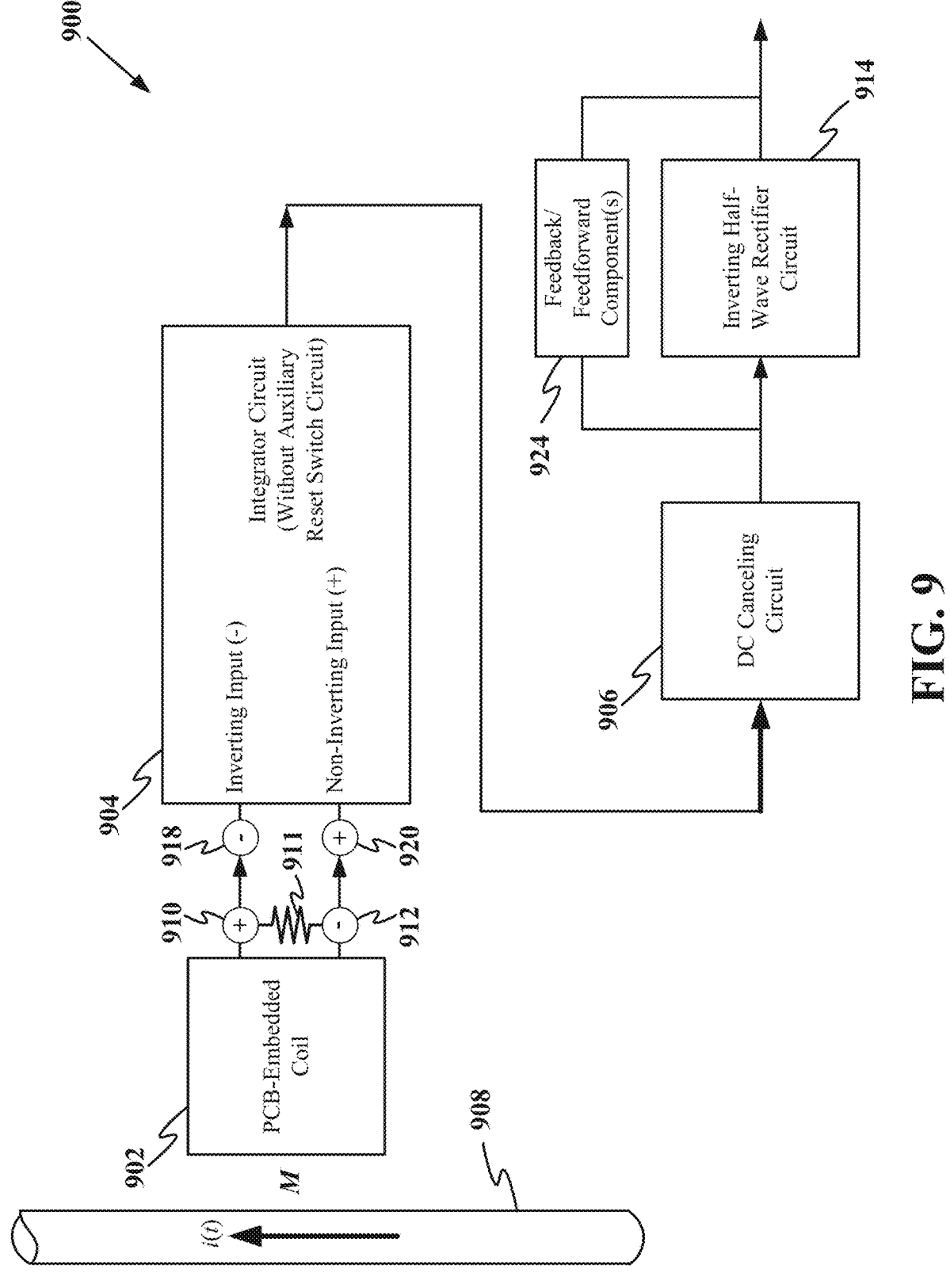
FIG. 9 is a block diagram of a PCB-embedded coil switch current sensor employing a DC canceling circuit and a half-wave rectifier circuit according to some aspects of the disclosure.

FIG. 9 is a block diagram of a PCB-embedded coil switch current sensor 900 employing a DC canceling circuit 906 and an inverting half-wave rectifier circuit 914 with feedback or feedforward component(s) 924 according to some aspects of the disclosure. The representative blocks and components may be realized with discrete components or one or more integrated circuits. The PCB-embedded coil switch current sensor 900 may detect a full-range switch current waveform (i.e., where full-range refers to switch current waveforms in both transition and steady-state) without an auxiliary reset circuit that would periodically reset an integrator circuit 904 of the PCB-embedded coil switch current sensor 900.

As shown in FIG. 9, the PCB-embedded coil switch current sensor 900 may include a PCB-embedded coil 902, a coil termination 911 (e.g., a resistor), an integrator circuit 904 (without an auxiliary reset circuit), a DC canceling circuit 906 (e.g., a DC blocking circuit or a high-pass filter), and an inverting half-wave rectifier circuit 914 with feedback or feedforward component(s) 924, according to some aspects of the disclosure. The PCB-embedded coil 902 may sense a current i(t) flowing through the conductor 908 according to some aspects of the disclosure.

The PCB-embedded coil 902 includes a first polarized output having a first positive output terminal 910 and a first negative output terminal 912. The integrator circuit 904 includes a first polarized input having a second negative input terminal 918 and a second positive input terminal 920. In the example of FIG. 9, to address the output voltage offset drift of the integrator circuit 904, the DC canceling circuit 906 may be inserted in series with the output of the integrator circuit 904. The addition of the DC canceling circuit 906 ensures that none of the DC voltage, current offsets, output voltage offsets, or other DC-related undesired attributes, are carried from the output of the integrator circuit 904 beyond the DC canceling circuit 906. A series capacitor may provide a means for blocking the DC voltage, current offsets, output voltage offsets, or other DC-related undesired attributes of the integrator circuit 904 (e.g., present at the output of the integrator circuit). The addition of the DC canceling circuit 906 provides for a stable integrator output that is immune to PCB-embedded coil switch current sensor 900 input supply (not shown) voltage variations, noise, and output voltage offset bias, or droop.

Figure 10:
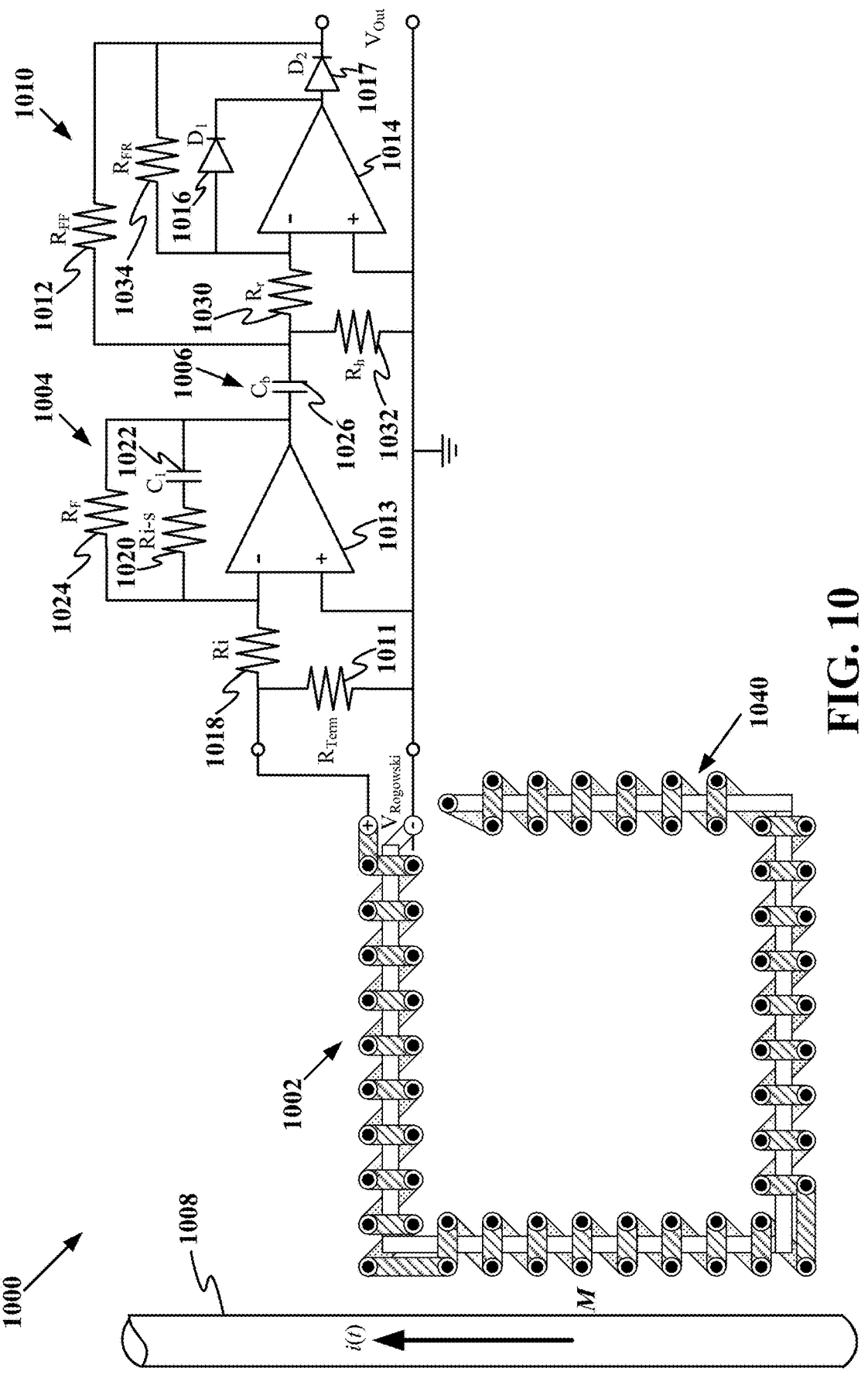
FIG. 10 is a schematic diagram of a PCB-embedded coil switch current sensor employing a DC canceling circuit and a half-wave rectifier circuit according to some aspects of the disclosure.

FIG. 10 is a schematic diagram of a PCB-embedded coil switch current sensor 1000 employing a DC canceling circuit 1006 and an absolute value average detector circuit 1010 (e.g., a half-wave rectifier circuit) according to some aspects of the disclosure. The configuration of the PCB-embedded coil switch current sensor 1000 removes a need to reset an integrator circuit 1004, which has been a need that was difficult to reach in other switch current sensors used, for example, in conjunction with modern high speed power electronics devices. The PCB-embedded coil switch current sensor 1000 of FIG. 10 may be similar to the PCB-embedded coil switch current sensor 900 of FIG. 9.

As described in connection with FIG. 9, the PCB-embedded coil switch current sensor 1000 may include a PCB-embedded coil 1002, a coil termination 1011 (e.g., a resistor ($R_{Term}$)), the integrator circuit 1004 (without an auxiliary reset circuit), a DC canceling circuit 1006 (e.g., a DC blocking circuit or a high-pass filter), and an absolute value average detector circuit 1010 (e.g., in this example depicted as a an inverting half-wave rectifier circuit), according to some aspects of the disclosure. The PCB-embedded coil 1002 may sense a current i(t) flowing through the conductor 1008 according to some aspects of the disclosure.

In examples of power electronics devices (such as but not limited to switching power converter and switching power supplies) where the signal to be measured is known to be of the switch current waveform type, that switch current waveform carries a DC component that is not detectable by the coil 1002 (because the coil measures the change of current as a function of time (di(t)/dt) and the DC component, by its definition, does not change, hence di(t)/dt is equal to zero for the coil 1002).

To address the lack of DC component measurement (of the current i(t) flowing through the conductor 1008), an absolute value average detector circuit 1010 may be added to obtain the DC component of the current i(t) flowing through the conductor 1008. In the example of FIG. 10, a half-wave rectifier circuit is depicted as a means for obtaining the DC component of the current i(t) flowing through the conductor 1008. It is noted that there is no DC path from the coil 1002 to the absolute value average detector circuit 1010 at least because of the presence of the DC canceling circuit 1006 (where a means for canceling any DC at the output of the op-amp 1013 of the integrator circuit 1004 is exemplified as a series capacitor 1026 ($C_b$)).

During an off state of a power electronics device (e.g., sourcing the current i(t) flowing through the conductor 1008), a measurement error at the output of the op-amp 1013 of the integrator circuit 1004 starts building up, causing the output of the op-amp 1013 of the integrator circuit 1004 to droop (to achieve a purely AC signal). However, during start-up of the power electronics device being measured, the first pulse in the current conductor 1008 starts from zero, and the measurement error at the output of the op-amp 1013 of the integrator circuit 1004 may be negligible to none for the first few measured pulses applied to the integrator circuit 1004.

The absolute value average detector circuit 1010 (exemplified in a non-limiting manner by a half-wave rectifier circuit) may be an inverting absolute value average detector circuit 1010 (e.g., an inverting half-wave rectifier circuit) and it may operate during the off state of the power electronics device being measured to prevent the measurement error from accumulating, hence providing a correct integration for every cycle. The absolute value average detector circuit 1010 (of which the inverting half-wave rectifier circuit is but one example) does not require external control input, in contrast, for example, to the auxiliary reset circuits described above.

The switch current, i(t), waveform may be changing between zero and a positive value. Hence, the inverting (e.g., negative) absolute value average detector circuit 1010 (exemplified by the inverting half-wave rectifier circuit) generates the inverse of the AC-coupled (e.g., DC blocked) output of the DC canceling circuit 1006 during the off cycle, and zero during the on state of the power electronics device. The (AC-coupled) integrator circuit 1004 output is fed forward thru the feed forward resistor 1012 (having the reference symbol $R_{FF}$) to the output of the absolute value average detector circuit 1010 (exemplified by the inverting half-wave rectifier circuit) (e.g., the output of the op-amp 1014), which corresponds to the switch current measurement. The operation of the absolute value average detector circuit 1010 configured as described cancels the droop effect at every off cycle instant. Because the integrator circuit 1004 error (due to lack of DC component measurement) starts from zero and builds up as the output from the integrator circuit 1004 reaches steady state (e.g., a continuous stream of same amplitude and width current switch pulses flows through the conductor 1008), there is no need for a large operating region for the absolute value average detector circuit 1010 (exemplified by the inverting half-wave rectifier circuit). This means, the droop canceling effect starts from the first pulse, and due to the operation of the absolute value average detector circuit 1010 (exemplified by the inverting half-wave rectifier circuit), the droop error is unable to grow over time. To measure signals with negative average value, the first diode 1016 (having the reference symbol $D_1$) is reversed.

The integrator circuit 1004 includes the integrator op-amp 1013. The output of the coil 1002 fed to the integrator circuit 1004 across the coil termination 1011 (having the reference symbol $R_{Term}$). The input flows through a series resistor 1018 (having the reference symbol Ri) and into the inverting input of the integrator op-amp 1013. The non-inverting input of the integrator op-amp 1013 is electrically coupled to ground. A first resistor 1020 (having the reference symbol Ri-s) and a first capacitor 1022 (having the reference symbol $C_1$) are electrically coupled in series. The series combination of the first resistor 1020 and the first capacitor 1022 is electrically coupled at the first resistor 1020 end to the inverting input of the integrator op-amp 1013 and electrically coupled at the first capacitor 1022 end to the output of the integrator op-amp 1013. A feedback resistor 1024 (having the reference symbol $R_F$) is electrically coupled across the integrator op-amp 1013 between the inverting input of the integrator op-amp 1013 and the output of the integrator op-amp 1013. Supply voltage terminals are not represented in FIG. 10 to avoid cluttering the drawing.

The exemplary inverting half-wave rectifier circuit (e.g., the absolute value average detector circuit 1010) includes an op-amp 1014. The output of the DC canceling circuit 1006 is fed to the inverting input of the op-amp 1014 through a series resistor 1030 (reference symbol $R_r$) and in parallel to a parallel resistor 1032 (reference symbol $R_h$). The output of the DC canceling circuit 1006 is also fed to the output of the op-amp 1014 through the feed forward resistor 1012. The first diode 1016 (reference symbol $D_1$) couples the inverting terminal of the op-amp 1014 to the output terminal of the op-amp 1014. A second resistor 1034 (reference symbol $R_{FR}$) couples the inverting terminal of the op-amp 1014 to an output of a second diode 1017 (reference symbol $D_2$) that is in series with the output of the op-amp 1014.

Figure 11:
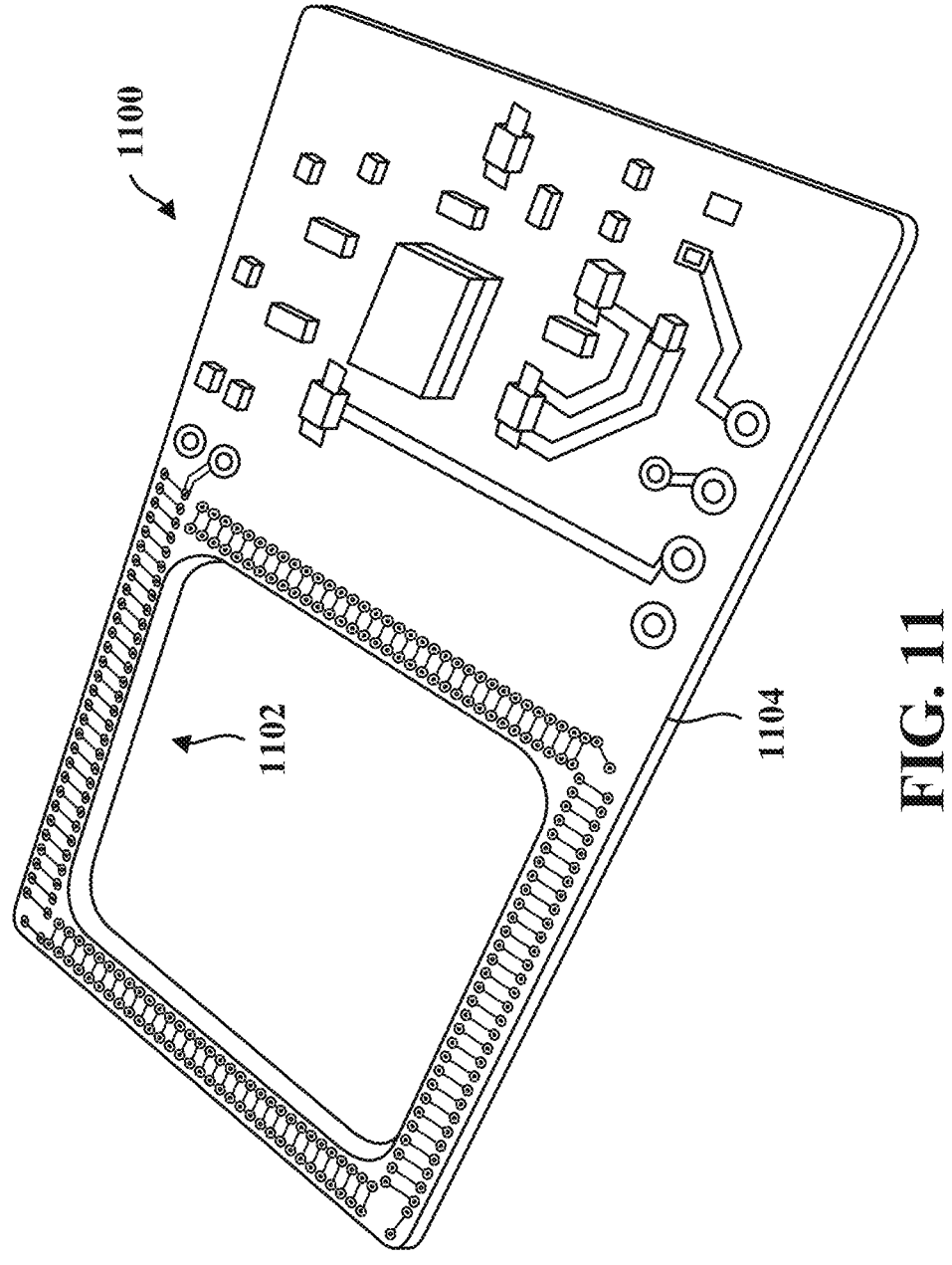
FIG. 11 is an illustration of a PCB-embedded coil switch current sensor employing a DC canceling circuit and a half-wave rectifier circuit according to some aspects of the disclosure.

FIG. 11 is an illustration of a PCB-embedded coil switch current sensor 1100 employing a PCB-embedded coil 1102, a coil termination, an integrator circuit, a DC canceling circuit, and an absolute value average detector circuit (e.g., a half-wave rectifier circuit) (all of which are configured in the electronics of the PCB 1104) according to some aspects of the disclosure. The PCB 1104 including the square-shaped PCB-embedded coil 1102 and components and electrical interconnects were fabricated and assembled according to the configuration as illustrated in FIG. 11. The square-shape geometry of the PCB-embedded coil 1102 provides space to maximize the number of turns of loops achieving a mutual inductance (M) of 2-3 nH. The square edge side length of 30 mm, the 3 mm coil's trace width, and the PCB height of 1.6 mm provides a form factor that may be used in conjunction with high-current commercial wide-bandgap power modules similar to CAS120M12BM2. The CAS120M12BM2 may be an example of a well-known high current, high voltage, high power silicon carbide (SiC) metal-oxide-semiconductor field-effect transistor (MOS-FET). Such a high current, high voltage, high power SiC MOSFET has ultrafast switching rising and falling times (e.g., less than 200 nanoseconds). The PCB-embedded coil 1102 of the example of the PCB-embedded coil switch current sensor 1100 was configured as a Rogowski coil. The performance of the PCB-embedded coil switch current sensor 1100 was validated over a wide range of frequencies and currents as detailed in FIGS. 12A-12E, below.

FIGS. 12A, 12B, 12C, 12D, and 12E are respective graphical depictions of oscilloscope displays obtained during testing of the PCB-embedded coil switch current sensor 1100, as shown and described in connection with FIG. 11, according to some aspects of the disclosure. In each of FIGS. 12A-12E, time is presented along the horizontal axis and amplitude is presented along the vertical axis. The PCB-embedded coil switch current sensor 1100 may be similar to the PCB-embedded coil switch current sensor 900 or 1000 as shown and described in connection with FIG. 9 or 10, respectively.

FIG. 12A is a graphical depiction of an oscilloscope display obtained during testing of a top switch of a DC-DC buck power converter by the PCB-embedded coil switch current sensor 1100 during continuous operation of the DC-DC buck power converter. The DC-DC buck power converter operated with a switching frequency ($f_{sw}$) of 1 MHz and a duty cycle=ninety percent) The upper trace 1202 is the output of a DC-50 MHz current probe (Tektronix TCP305A). The lower trace 1206 is the output of the PCB-embedded coil switch current sensor 1100.

The main reference to evaluate the performance of the proposed sensor in this set of experiments was a DC-50 MHz commercial current probe (Tektronix TCP305A). The PCB-embedded coil switch current sensor 1100 was set to read a top-device switch current waveform of a SiC half-bridge configured as a DC-DC buck converter. As shown in FIGS. 12C and 12D, the switching frequency is set to 1 MHZ, while the duty cycle is at ninety percent. These conditions result in a total of less than 100 ns for an off state. This extreme condition serves to prove the advantage of the PCB-embedded coil switch current sensor 1100 in comparison to existing solutions. FIG. 12C shows the start-up and indicates that the PCB-embedded coil switch current sensor 1100 can detect a wide range of frequency components at transitions. Moreover, the zoom-in capture of FIG. 12D depicts the accuracy of the PCB-embedded coil switch current sensor 1100 when measuring the 1 MHz switching signal while maintaining a very large linear gain.

FIG. 12B is a zoom-in capture of FIG. 12A. To observe the accuracy of the PCB-embedded coil switch current sensor 1100 at lower current levels, as well as its resolution in terms of detecting high-frequency oscillations, a specific duty cycle and load size were chosen, and the converter was operated at a 500 kHz switching frequency. As shown in FIG. 12E, the PCB-embedded coil switch current sensor 1100 can detect high-frequency oscillations of about 30 MHz, for a waveform with a maximum 11.8 A current level.

FIG. 12C is a zoom-in capture of the measured low-amplitude switch current waveform. In FIG. 12C, the switching frequency is 500 kHz, and the duty cycle is at fifty percent.

FIG. 12D is a zoom-out capture of the measured switch current waveform. The upper trace 1202 shows the performance of a DC-50 MHz current probe. The center trace 1204 shows the performance of the PCB-embedded coil switch current sensor 1100. To illustrate the performance of the PCB-embedded coil switch current sensor 1100 in terms of droop while in a steady-state condition, the converter was operated at a 500 kHz switching frequency. As a secondary reference, the 12 Hz-30 MHz commercial Rogowski probe was also tested. The lower trace 1206 shows the performance of the 12 Hz-30 MHz commercial Rogowski probe.

As can be seen in FIG. 12D, an uncompensated Rogowski coil (the commercial probe, lower trace 1206) droops at steady state, and naturally becomes an AC-coupled signal. In contrast, the PCB-embedded coil switch current sensor 1100 results (the center trace 1204) does not exhibit any droop at steady state. The PCB-embedded coil switch current sensor 1100 performance shows its ability to detect the full-range switch current waveform, with minimal data loss, high accuracy, and without the need for a periodic electronic reset. Based on the experimental results, the PCB-embedded coil switch current sensor 1100 has a sensitivity of 44 mV/A and can detect signals up to 30 MHz range.

The previously described aspects of droop and drift are noticed in inverting and noninverting active analog integrator circuits. As noted above in connection with the op-amp inverting integrator (e.g., the integrator circuit 1004 of FIG. 10), the feedback resistor (e.g., 408 of FIG. 4, feedback resistor 1024 of FIG. 10) limits the open-loop gain of the integrator and provides a low-pass magnitude response to the integrator circuit 1004. A similar feedback resistor (e.g., 407 in FIG. 4) in a noninverting integrator circuit (e.g., first integrator circuit 403 of FIG. 4) also limits the open-loop gain of the integrator and provides a low-pass magnitude response for the noninverting integrator. It is also noted that the phase responses of an inverting and a non-inverting integrator are 180 degrees apart.

Because a coil (e.g., a differential coil, a Rogowski coil) produces an output voltage in the vicinity of a changing magnetic flux, and no output voltage in the absence of a changing magnetic flux, the integrator coupled to the output of the coil does not reproduce any available DC components that exist in a measured changing magnetic flux (e.g., in a varying magnetic field). In other words, the integration of a measured zero is an unknown constant value, given an unknown initial value of an integration. The unknown initial value of the integration is the DC component of the measured changing magnetic flux. By way of illustration and not limitation, it is noted that a result of an integration of voltage spikes produced at the output of a coil has infinitely many answers in the absence of knowledge of the DC component value of the original signal (i.e., the measured changing magnetic flux). In addition, the op-amp-based integrator suffers from input voltage/current offset non-idealities, which appear at the output as a DC offset error.

Forcing an integrator circuit to start from zero at each integration cycle, for example by using an auxiliary reset circuit as described above, may provide some compensation for the unknown DC component that cannot be obtained; however, the use of an auxiliary reset circuit is problematic and undesirable. For example, in the case of switch current measurement, an integrator must be reset to zero every off cycle of the power electronics device sourcing the measured current. An auxiliary reset circuit that synchronizes the switching of the power electronics device to the opening and closing of a switch in the auxiliary reset circuit is impractical at the high switching frequencies utilized in power electronics today.

However, configuring a switch current sensor with a coil, a coil termination (e.g., a resistor), and an integrator as described herein facilitates the accurate sensing of the measured current from a few kilohertz up to multi-megahertz range. To fully address the switch current sensor errors, the configuration of the switch current sensor as described herein mitigates the inherent DC measurement error, as well as op-amp non-idealities. To mitigate the offset error due to op-amp non-idealities, the DC canceling circuit (e.g., 906 of FIG. 6, 1006 of FIG. 10) may be added to the output of the integrator circuit as shown in FIGS. 9 and 10. The use of the DC canceling circuit ensures that none of the op-amp non-idealities are reflected as a DC offset at the overall switch current sensor output. A switch current sensor whose output is the output of the DC canceling circuit may be referred to herein as an AC-coupled switch current sensor.

To compensate for the missing DC component information, a secondary switch current sensor may be allocated to obtain the DC component of the measured switch current waveform. The secondary switch current sensor having an output that includes the DC component of the measured switch current may be referred to herein as a DC measuring switch current sensor.

According to some aspects, a parallel group of switch current sensors could include at least one AC-coupled switch current sensor and at least one DC measuring switch current sensor. The outputs of the at least one AC-coupled switch current sensor and at least one DC measuring switch current sensor may be aggregated to produce a complete waveform of the measured switch current information.

Figures 13A, 13B:
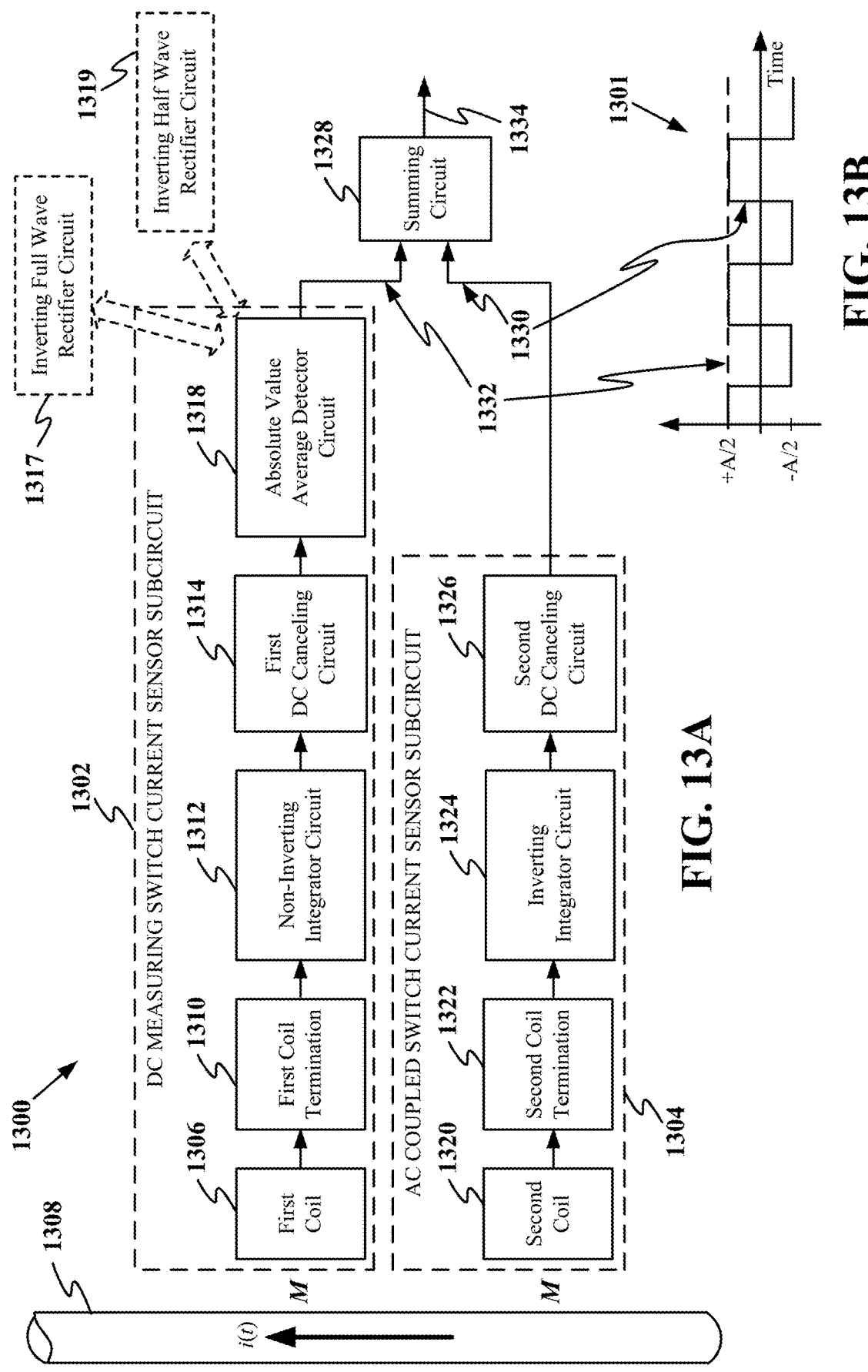
FIG. 13A is a block diagram of a switch current sensor according to some aspects of the disclosure.
FIG. 13B is graph illustrating outputs of subcircuits of the switch current sensor of FIG. 13A according to some aspects of the disclosure.

FIG. 13A is a block diagram of a switch current sensor 1300 according to some aspects of the disclosure. The representative blocks may be realized with discrete components or one or more integrated circuits. The switch current sensor 1300 is configured as a parallel combination of a plurality of switch current sensors and includes at least one DC measuring switch current sensor subcircuit 1302 and at least one AC coupled switch current sensor subcircuit 1304. FIG. 13B is graph 1301 illustrating outputs of the subcircuits (i.e., the at least one DC measuring switch current sensor subcircuit 1302 and the at least one AC coupled switch current sensor subcircuit 1304) of the switch current sensor 1300 of FIG. 13A according to some aspects of the disclosure.

As shown in FIG. 13B, the aggregated (e.g., added, summed) overall waveform at an output 1334 of the switch current sensor 1300 includes at least the rectified DC component 1332 of the measured switch current waveform (i.e., the DC component of the switch current i(t) flowing in the conductor 1308) obtained from the at least one DC measuring switch current sensor subcircuit 1302. Additionally, the aggregated (e.g., added, summed) overall output 1334 of the switch current sensor 1300 includes at least the AC coupled output 1330 of the of the measured switch current waveform (i.e., the AC components of the switch current i(t) flowing in the conductor 1308) obtained from the at least one AC coupled switch current sensor subcircuit 1304.

The at least one DC measuring switch current sensor subcircuit 1302 may include a first coil 1306. The first coil 1306 may be, for example, a differential coil. The first coil 1306 may sense a change in the magnetic flux of the current, i(t) flowing in the conductor 1308. To sense the current, there may be a mutual induction (M) between the first coil 1306 and the conductor 1308. A first coil termination 1310 may be coupled to the output of the first coil 1306. A non-inverting integrator circuit 1312 may be coupled to the first coil termination 1310 and the output of the first coil 1306 as described above in connection with FIG. 9, for example. The non-inverting integrator circuit 1312 may be coupled to a first DC canceling circuit 1314. The first DC canceling circuit 1314 may be coupled to an absolute value average detector circuit 1318 (e.g., an inverting full-wave rectifier circuit 1317, or alternatively an inverting half-wave rectifier circuit 1319). The absolute value average detector circuit 1318 may be coupled to a summing circuit 1328 (e.g., adding, aggregating). The configuration, functionality, and examples of means to implement the functionality of the first coil 1306, the first coil termination 1310, the non-inverting integrator circuit 1312, the first DC canceling circuit 1314, and the absolute value average detector circuit 1318 (e.g., the inverting full-wave rectifier circuit 1317, or alternatively the inverting half-wave rectifier circuit 1319) may be the same as or substantially similar to the similarly named components and circuits variously shown and described in connection with FIGS. 2, 4, 5, 8, 9, 10, and 11; their descriptions will not be repeated for the sake of brevity.

The at least one AC coupled switch current sensor subcircuit 1304 may include a second coil 1320. The second coil 1320 may be, for example, a differential coil. The second coil 1320 may sense a same change in the magnetic flux of the current, i(t) flowing in the conductor 1308 as the first coil 1306 of the DC measuring switch current sensor subcircuit 1302. As with the first coil 1306, there may be a mutual induction (M) between the second coil 1320 and the conductor 1308. A second coil termination 1322 may be coupled to the output of the second coil 1320. An inverting integrator circuit 1324 may be coupled to the second coil termination 1322 and the output of the second coil 1320 as described above in connection with FIG. 9 and FIG. 10, for example. The inverting integrator circuit 1324 may be coupled to a second DC canceling circuit 1326. In one example, the second DC canceling circuit 1326 may be coupled to the summing circuit 1328 (e.g., adding, aggregating).

Alternatively, a gain and/or bandwidth adjustment circuit (not shown, but similar to any of the gain and/or bandwidth adjustment circuit 1438, 1448 as shown and described in connection with FIG. 14) may be coupled between the second DC canceling circuit 1326 and the summing circuit 1328.

In some examples, where one or more respective AC coupled switch current sensor subcircuits (similar, for example, to the AC coupled switch current sensor subcircuit 1304) are coupled in parallel (not shown) and all feed the summing circuit 1328, one or more respective parameters associated with each of the one or more respective second coil 1320, respective second coil termination 1322, respective inverting integrator circuit 1324, and respective second DC canceling circuit 1326 may be adjusted to provide a wide bandwidth response representative of and inclusive of the AC components of the current, i(t), flowing in the conductor 1308.

The configuration, functionality, and examples of means to implement the functionality of the second coil 1320, the second coil termination 1322, the inverting integrator circuit 1324, and the second DC canceling circuit 1326 may be the same as or substantially similar to the similarly named components and circuits variously shown and described in connection with FIGS. 2, 4, 5, 8, 9, 10, and 11; their descriptions will not be repeated for the sake of brevity.

Figure 14:
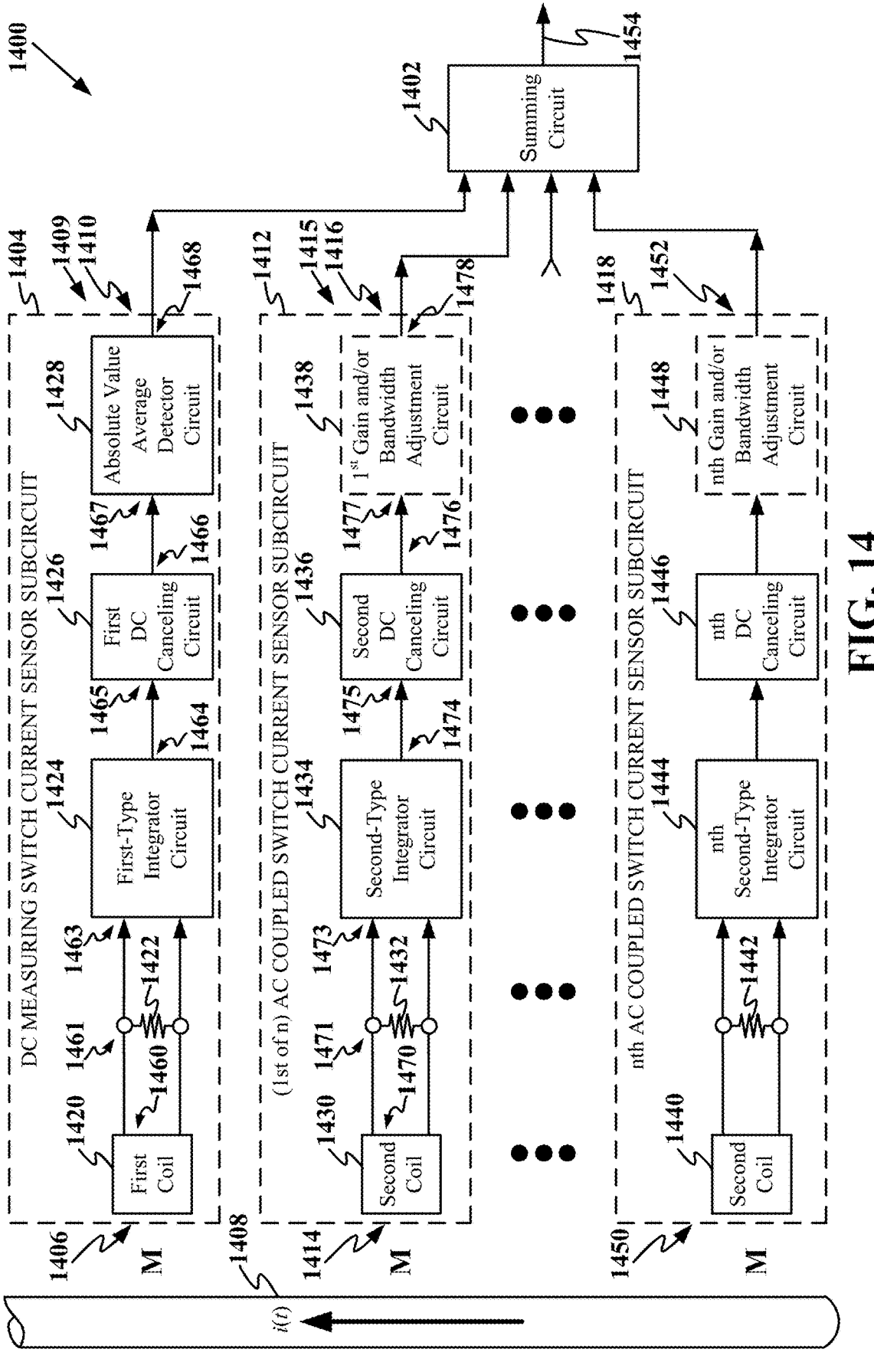
FIG. 14 is a block diagram of a switch current sensor according to some aspects of the disclosure.

FIG. 14 is a block diagram of a switch current sensor 1400 according to some aspects of the disclosure. The representative blocks and components may be realized with discrete components or one or more integrated circuits. The switch current sensor 1400 may be configured as a parallel group of multiple types of switch current sensors. The parallel group includes at least one first-type 1409 of switch current sensor (e.g., a DC measuring switch current sensor subcircuit 1404) and at least one second-type 1415 of switch current sensor (e.g., a first of the at least one AC coupled switch current sensor subcircuit 1412). In the illustration of FIG. 14, "n" AC coupled switch current sensor subcircuits are depicted, where n is a positive non-zero integer. Specifically, a plurality of AC coupled switch current sensor subcircuits, beginning with a first AC coupled switch current sensor subcircuit 1412 and ending with an nth AC coupled switch current sensor subcircuit 1418 are depicted. The nth AC coupled switch current sensor subcircuit 1418 may include a second coil 1440, a coil termination 1442, an nth second-type integrator circuit 1444, and optionally, an nth gain and/or bandwidth adjustment circuit 1448, all similar to the similarly named components of the first AC coupled switch current sensor subcircuit 1412 as shown and described herein. Each of the n AC coupled switch current sensor subcircuits may be tuned differently (e.g., to provide a partially overlapping frequency band responses).

According to some aspects, the switch current sensor 1400 may include a summing circuit 1402, at least one first-type 1409 switch current sensor subcircuit having a first input 1406 and a first output 1410 and configured to be coupled at the first input 1406 to a conductor 1408. As used herein, the term conductor may include materials of any shape (or form factor) that carry current, including, for example, and without limitation, metallic wire, printed circuit board (PCB) metallic traces (on a surface layer on an interior layer of the PCB), and semiconductor dies carrying current. In some aspects, the coupling may be noninvasive (e.g., via a mutual inductance, M, between a coil (e.g., the first coil 1420) configured in the at least one first-type 1409 switch current sensor and the conductor 1408) or may be invasive (e.g., via a series connection with the conductor 1408, not shown). The at least one first-type 1409 switch current sensor subcircuit (e.g., the DC measuring switch current sensor subcircuit 1404) may be further configured to be coupled at the first output 1410 to the summing circuit 1402.

The switch current sensor 1400 may also include at least one second-type 1415 switch current sensor subcircuit (e.g., at least one of the AC coupled switch current sensor subcircuit 1412, 1418, etc.) having a second input 1414, 1450 and a second output 1416, 1452 and configured to be coupled (e.g., via a mutual inductance, M) at the second input 1414, 1450 to the conductor 1408 and coupled at the second output 1416, 1452 to the summing circuit 1402.

According to some aspects, the summing circuit 1402 may be configured to aggregate (e.g., sum, add) the first output 1410 of the at least one first-type 1409 switch current sensor subcircuit and the second output(s) 1416, 1452 of the at least one second-type 1415 switch current sensor subcircuit (e.g., the AC coupled switch current sensor subcircuit(s) 1412, 1418)) to obtain a voltage waveform that is proportional to the switch current, i(t), configured to flow in the conductor 1408, the voltage waveform including a direct current (DC) component and steady-state AC components of the switch current. More particularly, and as used herein, the switch current may be a current that can be captured either right at the switch terminals (e.g., of a power electronics device) or any other location where this information exists.

According to some aspects, the at least one first-type 1409 switch current sensor subcircuit and the at least one second-type 1415 switch current sensor subcircuit may both be analog circuits. The at least one first-type 1409 switch current sensor subcircuit and the at least one second-type 1415 switch current sensor subcircuit (and circuits within these subcircuits) may be realized with discrete components or one or more integrated circuits.

According to some aspects, the at least one first-type 1409 switch current sensor subcircuit may be a DC measuring switch current sensor subcircuit 1404 and may include a first coil 1420 having output terminals 1460, a first coil termination 1422 (e.g., presented as, but not limited to, a self-integrating passive component, a resistor) having third terminals 1461 and coupled at the third terminals 1461 across the output terminals 1460 of the first coil 1420. The at least one first-type 1409 switch current sensor subcircuit may also include a first-type integrator circuit 1424 having fourth terminals 1463 at an input and a fourth output 1464 and may be coupled at the fourth terminals 1463 across the output terminals 1460 of the first coil 1420, in parallel with the first coil termination 1422.

The at least one first-type 1409 switch current sensor subcircuit may also include a first DC canceling circuit 1426 having a fifth input 1465 and a fifth output 1466 and coupled at the fifth input 1465 to the fourth output 1464 of the first-type integrator circuit 1424.

The at least one first-type 1409 switch current sensor subcircuit may also include an absolute value average detector circuit 1428 (e.g., an inverting half-wave rectifier circuit, an inverting full-wave rectifier circuit, or respective types of non-inverting rectifier circuits) having a sixth input 1467 and a sixth output 1468 and coupled at the sixth input 1467 to the fifth output 1466 of the first DC canceling circuit 1426 and at the sixth output 1468 to the summing circuit 1402.

In some examples, the first-type integrator circuit 1424 may be a non-inverting integrator circuit, and the absolute value average detector circuit 1428 may be an inverting circuit, such as, but not limited to an inverting half-wave rectifier circuit or an inverting full-wave rectifier circuit. By way of example and without limitation, in a first configuration, the first-type integrator circuit 1424 may be a non-inverting integrator circuit and the absolute value average detector circuit 1428 may be an inverting absolute value average detector circuit 1428, and in a different second configuration, the first-type integrator circuit 1424 may be an inverting integrator circuit and the absolute value average detector circuit 1428 may be a non-inverting absolute value average detector circuit 1428.

In some examples, the absolute value average detector circuit 1428 may be configured to receive, at the sixth input 1467, a voltage waveform proportional to the switch current without a DC component of the switch current, and obtain, at the sixth output 1468, a signal (or waveform) representative of the DC component of the switch current i(t).

Accordingly, the DC component may be derived from the voltage waveform present at the fifth output 1466 of the first DC canceling circuit 1426, which, due to the DC blocking aspect of the first DC canceling circuit 1426, has no DC component. In some examples, the absolute value average detector circuit 1428 may be at least one of: a half-wave rectifier circuit, or a full-wave rectifier circuit. In some examples, the absolute value average detector circuit may be configured to not allow a drift (or droop) to start at the output of the absolute value average detector circuit 1428.

In the example of FIG. 14, n second-type 1415 switch current sensor subcircuit(s) are depicted, where n is equal to a positive non-zero value. For ease of explanation, the first of the n second-type 1415 switch current sensor subcircuit(s) will be described. The second-type 1415 switch current sensor subcircuit may be exemplified as an AC coupled switch current sensor subcircuit 1412 The description is applicable to the remaining n−1 second-type 1415 switch current sensor subcircuit(s).

According to some aspects, the at least one second-type 1415 switch current sensor subcircuit (e.g., an AC coupled switch current sensor subcircuit 1412) may include a second coil 1430 having output terminals 1470 and a second coil termination 1432 having a third terminals 1471 and may be coupled at the third terminals 1471 across the output terminals 1470 of the second coil 1430.

The at least one second-type 1415 switch current sensor subcircuit may also include a second-type integrator circuit 1434 having fourth terminals 1473 at an input and a fourth output 1474 and may be coupled at the fourth terminals 1473 across the output terminals 1470 of the second coil 1430, in parallel with the second coil termination 1432. In some examples, the second-type integrator circuit 1434 may be an inverting integrator circuit.

The at least one second-type 1415 switch current sensor subcircuit may also include a second DC canceling circuit 1436 having a fifth input 1475 and a fifth output 1476 and may be coupled at the fifth input 1475 to the fourth output 1474 of the second-type integrator circuit 1434. The second DC canceling circuit may be configured as a DC block, or a high pass filter (that does not permit DC current to flow out of the second DC canceling circuit 1436. One non-limiting example of means for the second DC canceling circuit 1436 may be a series capacitor such as the series capacitor 1026 as shown and described in connection with FIG. 10. According to some aspects, the second DC canceling circuit 1436 may be coupled at the fifth output 1476 to the summing circuit 1402.

Alternatively, one or more respective ones of the second-type 1415 switch current sensor subcircuit (e.g., one or more of the first of n AC coupled switch current sensor subcircuit 1412 through the nth AC coupled switch current sensor subcircuit 1418) may further include a first gain and/or bandwidth adjustment circuit 1438 (e.g., at least one gain or bandwidth circuit) having a sixth input 1477 and a sixth output 1478, where the fifth output 1476 of the second DC canceling circuit 1436 may be coupled with the sixth input 1477 of the first gain and/or bandwidth adjustment circuit 1438 (instead of the being coupled to the summing circuit 1402) and the sixth output 1478 may be coupled to the summing circuit 1402. In some examples, the functions of the gain and/or bandwidth adjustment circuit 1438 may be realized by tuning other components, such as, for example, components or parameters of the second coil 1430, the second coil termination 1432, the second-type integrator circuit 1434, and/or the second DC canceling circuit 1436. Accordingly, in some examples, one or more of the various AC coupled switch current sensor subcircuits 1412, 1418, may omit the gain and or bandwidth adjustment circuit 1438, 1448.

According to some aspects, the at least one second-type 1415 switch current sensor subcircuit is a plurality second-type 1415 switch current sensor subcircuits (e.g., a plurality of n AC coupled switch current sensor subcircuit 1412, 1418), and each of the plurality of second-type 1415 switch current sensor subcircuits may configured to sense a respective portion of a total switch current sensor frequency bandwidth. In some examples, each sensed respective portion of the total switch current sensor frequency bandwidth spans a respective bandwidth that is less than the total switch current sensor frequency bandwidth, and an aggregated combination of respective outputs of the plurality of second-type 1415 switch current sensor subcircuits may provide an aggregated bandwidth (e.g., overall, composite, inclusive summed, added) that is equal to the total switch current sensor frequency bandwidth. According to some aspects, each sensed respective portion of the total switch current sensor frequency bandwidth may partially overlap with a neighboring (e.g., higher or lower frequency) respective portion of the total switch current sensor frequency bandwidth.

In some examples, the at least one first-type 1409 switch current sensor subcircuit includes a first-type integrator circuit 1424 and an absolute value average detector circuit 1428, which together are configured to produce the DC component of the switch current, i(t).

In some examples, the first-type integrator circuit 1424 may be a non-inverting integrator circuit, and the absolute value average detector circuit 1428 may be an inverting absolute value average detector circuit 1428. In some examples, the first-type integrator circuit 1424 may be an inverting integrator circuit, and the absolute value average detector circuit 1428 may be a non-inverting absolute value average detector circuit 1428. In some examples, the absolute value average detector circuit 1428 may be at least one of: a half-wave rectifier circuit, or a full-wave rectifier circuit.

According to some aspects, in connection with the switch current sensor 1400, the at least one DC measuring switch current sensor subcircuit 1404 utilizes the first-type integrator circuit 1424, combined with an absolute value average detector circuit 1428 (e.g., an inverting half-wave rectifier circuit or an inverting full-wave rectifier), and first DC canceling circuit 1426 to obtain the voltage waveform representative of the DC component of the measured switch current (e.g., i(t) flowing in conductor 1408). In this manner, the offset related to the non-idealities in the op-amps of the first-type integrator circuit 1424 (e.g., a non-inverting integrator circuit) are canceled, while the lack of DC component measurement at the output of the summing circuit is compensated by the at least one DC measuring switch current sensor subcircuit 1404 output. Offset related to the non-idealities in the respective op-amps of the second-type integrator circuit 1434, 1444 (e.g., inverting integrator circuit(s)) may be canceled by respective uses of the respective second DC canceling circuit 1436 through nth DC canceling circuit 1446, for example.

The aggregated (e.g., added, summed) overall output 1454 of the switch current sensor 1400 includes at least the DC component of the measured/sensed switch current waveform (i.e., the DC component of the switch current i(t) flowing in the conductor 1308) obtained from the at least one DC measuring switch current sensor subcircuit 1302. Additionally, the aggregated overall output 1454 of the switch current sensor 1400 includes at least AC components of the switch current i(t) flowing in the conductor 1408 obtained from the at least one AC coupled switch current sensor subcircuit 1412.

Figure 15:
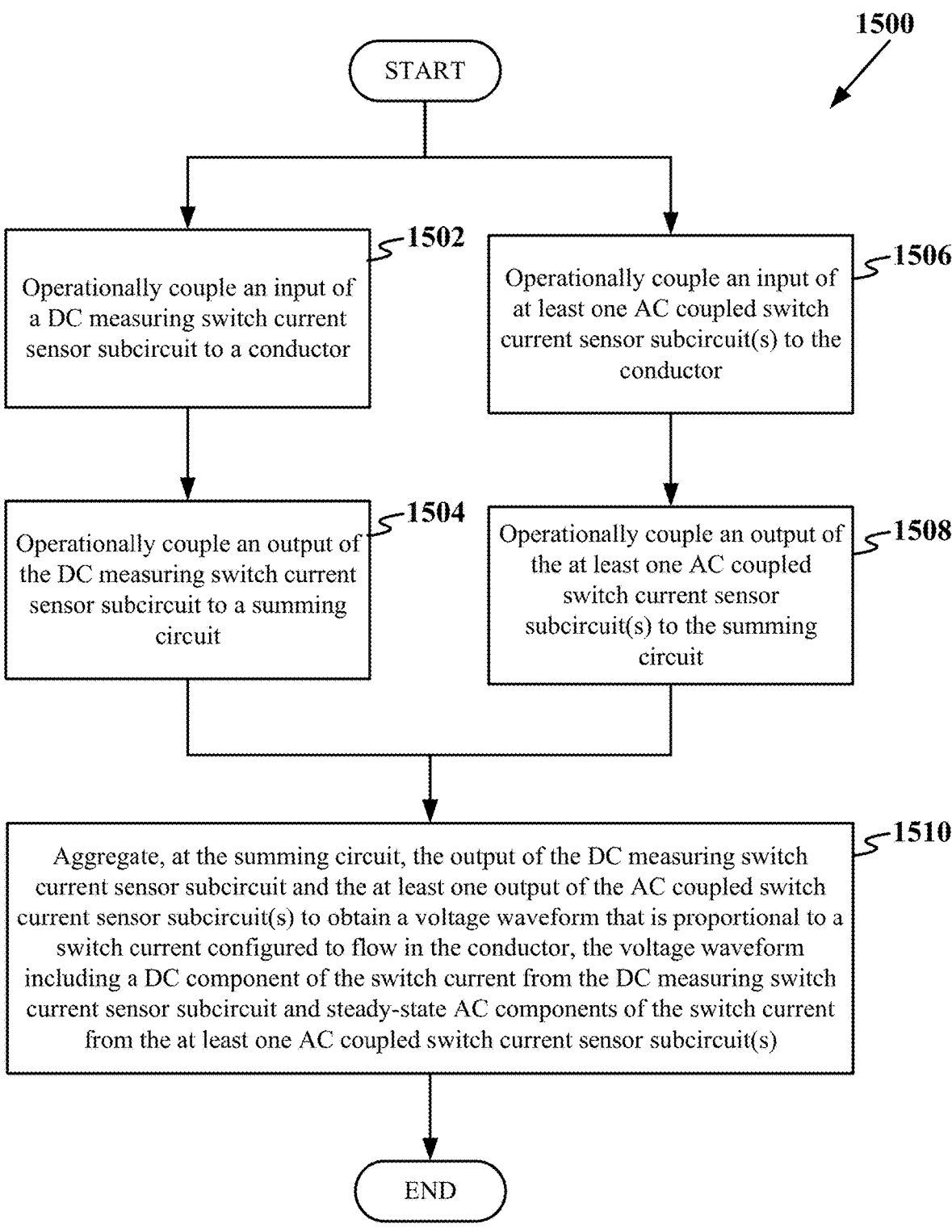
FIG. 15 is a flow chart illustrating an example process operational at a switch current sensor according to some aspects of the disclosure.

FIG. 15 is a flow chart illustrating an example process 1500 (e.g., a method) operational at a switch current sensor in accordance with some aspects of the disclosure. As described below, some or all illustrated features may be omitted in a particular implementation within the scope of the present disclosure, and some illustrated features may not be required for implementation of all embodiments. In some examples, the process 1500 may be carried out by the switch current sensor 900, 1000, 1300, or 1400 as illustrated and described in connection with FIGS. 9, 10, 13, and 14 respectively. In some examples, the process 1500 may be carried out by any suitable apparatus or means for carrying out the functions or algorithm described below.

At block 1502, the switch current sensor may be coupled, at an input of a DC measuring switch current sensor subcircuit to a conductor. For example, the first coil 1306 or the first coil 1420 as shown and described in connection FIG. 13 or FIG. 14, respectively, may provide a means for the at least one first-type switch current sensor subcircuit having a first input and a first output to be coupled at the first input to the conductor.

At block 1504, the switch current sensor may be coupled at an output of the DC measuring switch current sensor subcircuit to a summing circuit. For example, an output terminal or node of the absolute value average detector circuit 1318 of FIG. 13 or the output (terminal or node) of the absolute value average detector circuit 1428 of FIG. 14 may provide a means for the at least one first-type switch current sensor subcircuit to be coupled at the first output to the summing circuit.

At block 1506 the switch current sensor may be coupled at an input of at least one AC coupled switch current sensor subcircuit(s) to the conductor. For example, the second coil 1320 or the second coil 1430 as shown and described in connection FIG. 13 or FIG. 14, respectively, may provide a means for the at least one second-type switch current sensor subcircuit having an input and an output to be coupled at the input of the at least one AC coupled switch current sensor subcircuit to the conductor.

At block 1508, the switch current sensor may be coupled at an output of the at least one AC coupled switch current sensor subcircuit(s) to the summing circuit. For example, an output (e.g., terminal or node) of the second DC canceling circuit 1326 of the AC coupled switch current sensor subcircuit 1304 of FIG. 13 or the output (e.g., terminal or node) of the second DC canceling circuit 1436 or the first gain and/or bandwidth adjustment circuit 1438 of the AC coupled switch current sensor subcircuit 1412 of FIG. 14 may provide a means for the at least one second-type switch current sensor subcircuit to be coupled at the first output to the summing circuit.

At block 1510, the switch current sensor may aggregate, at the summing circuit, the output of the DC measuring switch current sensor subcircuit and the at least one output of the AC coupled switch current sensor subcircuit(s) to obtain a voltage waveform that is proportional to a switch current configured to flow in the conductor, the voltage waveform including a DC component of the switch current from the DC measuring switch current sensor subcircuit and steady-state AC components of the switch current from the AC coupled switch current sensor subcircuit(s). For example, the summing circuit 1328 as shown and described in connection with FIG. 13 or the summing circuit 1402 as shown and described in connection with FIG. 14 may provide a means for aggregating the first output of the at least one first-type switch current sensor subcircuit and the second output of the at least one second-type switch current sensor subcircuit to obtain a voltage waveform that is proportional to a switch current configured to flow in the conductor, the voltage waveform including a direct current (DC) component and steady-state AC components of the switch current.

Of course, in describing the features above, the circuitry is provided as an example. The aspects described herein may be embodied in many different forms and should not be construed as limited to the examples set forth herein; rather, these examples are provided so that this disclosure will satisfy applicable legal requirements. Other means for carrying out the described functions may be included within various aspects of the present disclosure, including but not limited to the instructions stored in a computer-readable medium or any other suitable apparatus or means described in any one of the FIGS. 2, 4, 5, 9, 10, 13A, and/or 14, and utilizing, for example, any processes described herein.

The following provides an overview of aspects of the present disclosure:

Aspect 1: A switch current sensor, comprising: a summing circuit; at least one first-type switch current sensor subcircuit having a first input and a first output and configured to be coupled at the first input to a conductor, and coupled at the first output to the summing circuit; and at least one second-type switch current sensor subcircuit having a second input and a second output and configured to be coupled at the second input to the conductor and coupled at the second output to the summing circuit, wherein the summing circuit is configured to aggregate the first output of the at least one first-type switch current sensor subcircuit and the second output of the at least one second-type switch current sensor subcircuit to obtain a voltage waveform that is proportional to a switch current configured to flow in the conductor, the voltage waveform including a direct current (DC) component and steady-state AC components of the switch current.

Aspect 2: The switch current sensor of aspect 1, wherein the at least one first-type switch current sensor subcircuit and the at least one second-type switch current sensor subcircuit are both analog circuits.

Aspect 3: The switch current sensor of aspect 1 or aspect 2, wherein the at least one first-type switch current sensor subcircuit comprises: a first coil having output terminals; a first coil termination having third terminals and coupled at the third terminals across the output terminals of the first coil; a first-type integrator circuit having fourth terminals at an input and a fourth output and coupled at the fourth terminals across the output terminals of the first coil, in parallel with the first coil termination; a first direct current (DC) canceling circuit having a fifth input and a fifth output and coupled at the fifth input to the fourth output of the first-type integrator circuit; and an absolute value average detector circuit having sixth input and a sixth output and coupled at the sixth input to the fifth output of the first DC canceling circuit and at the sixth output to the summing circuit and configured to obtain the DC component of the switch current.

Aspect 4: The switch current sensor of any of aspects 1 through 3, wherein the absolute value average detector circuit is at least one of: a half-wave rectifier circuit, or a full-wave rectifier circuit.

Aspect 5: The switch current sensor of any of aspects 1 through 4, wherein: in a first configuration, the first-type integrator circuit is a non-inverting integrator circuit and the absolute value average detector circuit is an inverting absolute value average detector circuit, and in a different second configuration, the first-type integrator circuit is an inverting integrator circuit and the absolute value average detector circuit is a non-inverting absolute value average detector circuit.

Aspect 6: The switch current sensor of any of aspects 1 through 5, wherein the absolute value average detector circuit is configured to: receive, at the sixth input, the voltage waveform proportional to the switch current without the DC component of the switch current, and obtain, at the sixth output, the DC component of the switch current.

Aspect 7: The switch current sensor of any of aspects 1 through 6, wherein the at least one second-type switch current sensor subcircuit comprises: a second coil having output terminals; a second coil termination having third terminals and coupled at the third terminals across the output terminals of the second coil; a second-type integrator circuit having fourth terminals at an input and a fourth output and coupled at the fourth terminals across the output terminals of the second coil, in parallel with the second coil termination; a second direct current (DC) canceling circuit having a fifth input and a fifth output and coupled at the fifth input to the fourth output of the second-type integrator circuit and coupled at the fifth output to the summing circuit.

Aspect 8: The switch current sensor of aspect 6, wherein the at least one second-type switch current sensor subcircuit further comprises: at least one first gain or bandwidth adjustment circuit having sixth input and a sixth output, wherein the fifth output of the second DC canceling circuit is coupled at the sixth input of the at least one of the first gain or bandwidth adjustment circuit to the fifth output of the second DC canceling circuit and at the sixth output to the summing circuit.

Aspect 9: The switch current sensor of any of aspects 1 through 8, wherein: the second-type integrator circuit is an inverting integrator circuit.

Aspect 10: The switch current sensor of any of aspects 1 through 9, wherein the at least one second-type switch current sensor subcircuit is a plurality of second-type switch current sensor subcircuits (1412, . . . , 1418), and each of the plurality of second-type switch current sensor subcircuits (1412, . . . , 1418) is configured to sense a respective portion of a total switch current sensor frequency bandwidth.

Aspect 11: The switch current sensor of aspect 10, wherein each sensed respective portion of the total switch current sensor frequency bandwidth spans a respective bandwidth that is less than the total switch current sensor frequency bandwidth, and an aggregated combination of respective outputs of the plurality of second-type switch current sensor subcircuits (1412, . . . , 1418) provides an aggregated bandwidth that is equal to the total switch current sensor frequency bandwidth.

Aspect 12: The switch current sensor of any of aspects 1 through 11, wherein the at least one first-type switch current sensor subcircuit comprises: a first-type integrator circuit and an absolute value average detector circuit, which together are configured to produce the DC component of the switch current.

Aspect 13: The switch current sensor of aspect 12, wherein the first-type integrator circuit is a non-inverting integrator circuit, and the absolute value average detector circuit is an inverting absolute value average detector circuit.

Aspect 14: The switch current sensor of aspect 13, wherein the absolute value average detector circuit is at least one of: a half-wave rectifier circuit, or a full-wave rectifier circuit.

Aspect 15: A switch current sensor, comprising: means for a summing circuit; means for at least one first-type switch current sensor subcircuit having a first input and a first output to be configured to be coupled (M) at the first input to a conductor, and coupled at the first output to the summing circuit; and means for at least one second-type switch current sensor subcircuit having a second input and a second output to be configured to be coupled (M) at the second input to the conductor and coupled at the second output to the summing circuit, wherein the means for the summing circuit is configured to aggregate the first output of the at least one first-type switch current sensor subcircuit and the second output of the at least one second-type switch current sensor subcircuit to produce a voltage waveform that is proportional to a switch current configured to flow in the conductor, the voltage waveform including a direct current (DC) component and steady-state AC components of the switch current.

Aspect 16: The switch current sensor of aspect 15, wherein the means for the at least one first-type switch current sensor subcircuit comprises: means for a first coil having output terminals; means for a first coil termination having third terminals and coupled at the third terminals across the output terminals of the first coil; means for a first-type integrator circuit having fourth terminals at an input and a fourth output and coupled at the fourth terminals across the output terminals of the first coil, in parallel with the first coil termination; means for a first direct current (DC) canceling circuit having a fifth input and a fifth output and coupled at the fifth input to the fourth output of the first-type integrator circuit; and means for an absolute value average detector circuit having sixth input and a sixth output and coupled at the sixth input to the fifth output of the means for the first DC canceling circuit and at the sixth output to the means for the summing circuit and configured to obtain the DC component of the switch current.

Aspect 17: The switch current sensor of aspect 15 or 16, wherein the means for the absolute value average detector circuit is at least one of: a half-wave rectifier circuit, or a full-wave rectifier circuit.

Aspect 18: The switch current sensor of any of aspects 15 through 17, wherein the means for the absolute value average detector circuit comprises: means for receiving, at the sixth input, the voltage waveform proportional to the switch current without the DC component of the switch current, and means for producing, at the sixth output, the DC component of the switch current.

Aspect 19: The switch current sensor of any of aspects 15 through 18, wherein the means for the at least one second-type switch current sensor subcircuit comprises: means for a second coil having output terminals; means for a second coil termination having third terminals and coupled at the third terminals across the output terminals of the second coil; means for a second-type integrator circuit having fourth terminals at an input and a fourth output and coupled at the fourth terminals across the output terminals of the second coil, in parallel with the second coil termination; and means for a second direct current (DC) canceling circuit having a fifth input and a fifth output and coupled at the fifth input to the fourth output of the second-type integrator circuit and coupled at the fifth output to the means for the summing circuit.

Aspect 20: The switch current sensor of any of aspects 15 through 19, wherein the at least one of the means for the at least one first-type switch current sensor subcircuit comprises: means for a first-type integrator circuit and means for an absolute value average detector circuit, which together are configured to produce the DC component of the switch current.

Several aspects of a wireless communication network have been presented with reference to an exemplary implementation. As those skilled in the art will readily appreciate, various aspects described throughout this disclosure may be extended to other telecommunication systems, network architectures and communication standards.

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the aspects herein, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The terms "couple" and "coupled" may be used herein to refer to configurations where components may have direct electrical connection therebetween, wireless connection therebetween, and/or magnetic (electro-magnetic) associations with the components; to couple, being coupled, or coupling in the context of configurations between components of circuit(s) described herein does not require that the circuit(s) be "on" or be in a state of active communication. The term "coupled" may be also be used herein to refer to the direct or indirect physical coupling (as opposed to communicative coupling) between two objects. For example, if object A physically touches object B, and object B touches object C, then objects A and C may still be considered coupled to one another even if they do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-15 may be rearranged and/or combined into a single component, step, feature, or function or embodied in several components, steps, or functions. Additional elements, components, steps, and/or functions may also be added without departing from novel features disclosed herein. The apparatus, devices, and/or components illustrated in FIGS. 1-15 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order and are not meant to be limited to the specific order or hierarchy presented unless specifically recited therein. While some examples illustrated herein depict only time and frequency domains, additional domains such as a spatial domain are also contemplated in this disclosure.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. The word "obtain" as used herein may mean, for example, acquire, calculate, generate, produce, construct, derive, determine, receive, and/or retrieve. The preceding list is exemplary and not limiting. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112 (f) unless the element is expressly recited using the phrase "means for" or, in the case of a method claim, the element is recited using the phrase "step for."

What is claimed is:

1. A switch current sensor, comprising:
   a summing circuit;
   at least one first-type switch current sensor subcircuit having a first input and a first output and configured to be coupled at the first input to a conductor, and coupled at the first output to the summing circuit; and
   at least one second-type switch current sensor subcircuit having a second input and a second output and configured to be coupled at the second input to the conductor and coupled at the second output to the summing circuit,
   wherein the summing circuit is configured to aggregate the first output of the at least one first-type switch current sensor subcircuit and the second output of the at least one second-type switch current sensor subcircuit to obtain a voltage waveform that is proportional to a switch current configured to flow in the conductor, the voltage waveform including a direct current (DC) component and steady-state alternating current (AC) components of the switch current,
   wherein the at least one first-type switch current sensor subcircuit comprises:
   a first-type integrator circuit and an absolute value average detector circuit, which together are configured to produce the DC component of the switch current, and
   wherein the at least one second-type switch current sensor subcircuit comprises:
   a second coil having second coil output terminals,
   a second coil termination having second coil termination terminals and coupled at the second coil termination terminals across the second coil output terminals,
   a second-type integrator circuit having second-type integrator input terminals and a second-type integrator output terminal and coupled at the second-type integrator input terminals across the second coil output terminals, in parallel with the second coil termination,
   a second DC canceling circuit having a second DC canceling circuit input and a second DC canceling circuit output and coupled at the second DC canceling circuit input to the second-type integrator output terminal and coupled at the second DC canceling circuit output to the summing circuit, and
   at least one gain or bandwidth adjustment circuit having an adjustment circuit input and an adjustment circuit output, wherein the second DC canceling circuit output is coupled at the adjustment circuit input to the second DC canceling circuit output and at the adjustment circuit output to the summing circuit.

2. The switch current sensor of claim 1, wherein the at least one first-type switch current sensor subcircuit comprises:

a first coil having first coil output terminals;

a first coil termination having first coil termination terminals and coupled at the first coil termination terminals across the first coil output terminals;

the first-type integrator circuit having first-type integrator input terminals and a first-type integrator output terminal and coupled at the first-type integrator input terminals across the first coil output terminals, in parallel with the first coil termination;

a first DC canceling circuit having a first DC canceling circuit input and a first DC canceling circuit output and coupled at the first DC canceling circuit input to the first-type integrator output terminal; and the absolute value average detector circuit having a detector circuit input and a detector circuit output and coupled at the detector circuit input to the first DC canceling circuit output and at the detector circuit output to the summing circuit.

3. The switch current sensor of claim 2, wherein the absolute value average detector circuit is at least one of:

a half-wave rectifier circuit, or a full-wave rectifier circuit.

4. The switch current sensor of claim 2, wherein the at least one second-type switch current sensor subcircuit comprises the second-type integrator circuit, and the first-type integrator circuit is a non-inverting integrator circuit, the absolute value average detector circuit is an inverting absolute value average detector circuit, and the second-type integrator circuit is an inverting integrator circuit; or the first-type integrator circuit is the inverting integrator circuit, the absolute value average detector circuit is a non-inverting absolute value average detector circuit, and the second-type integrator circuit is the non-inverting integrator circuit.

5. The switch current sensor of claim 2, wherein the absolute value average detector circuit is configured to:

obtain, at the detector circuit input, the voltage waveform proportional to the switch current without the DC component of the switch current; and obtain, at the detector circuit output, the DC component of the switch current.

6. The switch current sensor of claim 1, wherein the at least one second-type switch current sensor subcircuit is a plurality of second-type switch current sensor subcircuits, and each of the plurality of second-type switch current sensor subcircuits is configured to sense a respective portion of a total switch current sensor frequency bandwidth.

7. The switch current sensor of claim 6, wherein each sensed respective portion of the total switch current sensor frequency bandwidth spans a respective bandwidth that is less than the total switch current sensor frequency bandwidth, and an aggregated combination of respective outputs of the plurality of second-type switch current sensor subcircuits provides an aggregated bandwidth that is equal to the total switch current sensor frequency bandwidth.

8. A switch current sensor, comprising:

means for summing;

first means for sensing current having a first input and a first output to be configured to be coupled (M) at the first input to a conductor, and coupled at the first output to the means for summing; and second means for sensing current having a second input and a second output to be configured to be coupled (M) at the second input to the conductor and coupled at the second output to the means for summing,

wherein the means for summing circuit is configured to aggregate the first output of the first means for sensing current and the second output of the second means for sensing current to produce a voltage waveform that is proportional to a switch current configured to flow in the conductor, the voltage waveform including a direct current (DC) component and steady-state alternating current (AC) components of the switch current, wherein the first means for sensing current comprises:

a first means for integrating and a means for absolute value average detecting, which together are configured to produce the DC component of the switch current, and wherein the second means for sensing current comprises:

a second coil having second coil output terminals, a second coil termination having second coil termination terminals and coupled at the second coil termination terminals across the second coil output terminals, a second means for integrating having second means for integrating input terminals and a second means for integrating output terminal and coupled at the second means for integrating input terminals across the second coil output terminals, in parallel with the second coil termination, second means for DC canceling having a second means for DC canceling input and a second means for DC canceling output and coupled at the second means for canceling input to the second means for integrating output terminal and coupled at the second means for DC canceling output to the means for summing, and means for adjusting gain or bandwidth having a means for adjusting input and a means for adjusting output, wherein the second means for DC canceling output is coupled at the means for adjusting input to the second means for DC canceling output and at the means for adjusting output to the means for summing.

9. The switch current sensor of claim 8, wherein the first means for sensing current comprises:

a first coil having first coil output terminals;

a first coil termination having first coil termination terminals and coupled at the first coil termination terminals across the first coil output terminals;

the first means for integrating having first-type integrator input terminals and a first-type integrator output and coupled at the first-type integrator input terminals across the first coil output terminals, in parallel with the first coil termination;

first means for DC canceling having a first means for DC canceling input and a first means for DC canceling output and coupled at the first means for DC canceling input to the first-type integrator output; and the means for absolute value average detecting having a means for absolute value average detecting input and a means for absolute value average detecting output and coupled at the means for absolute value average detecting input to the first means for DC canceling output and at the means for absolute value average detecting output to the means for summing and configured to obtain the DC component of the switch current.

10. The switch current sensor of claim 9, wherein the means for absolute value average detecting is at least one of:

a half-wave rectifier circuit; or a full-wave rectifier circuit.

11. The switch current sensor of claim 9, wherein the means for absolute value average detecting comprises:

means for obtaining, at the means for absolute value average detecting input, the voltage waveform proportional to the switch current without the DC component of the switch current; and means for obtaining, at the means for absolute value average detecting output, the DC component of the switch current.

12. The switch current sensor of claim 9, wherein:

the first means for integrating and the means for absolute value average detecting are:

a non-inverting integrator circuit and an inverting absolute value average detector circuit, respectively; or an inverting integrator circuit and a non-inverting absolute value average detector circuit, respectively.

13. A switch current sensor, comprising:

a summing circuit;

a first-type switch current sensor subcircuit comprising:

a first coil configured to be coupled to a conductor;

a first-type integrator circuit having first-type integrator input and a first integrator output and coupled at the first-type integrator input to the first coil;

a first direct current (DC) canceling circuit having a first DC canceling input and a first DC canceling output and coupled at the first DC canceling input to the first integrator output;

an absolute value average detector circuit having an absolute value average input and an absolute value average output, coupled at the absolute value average input to the first DC canceling output, and coupled at the absolute value average output to the summing circuit, wherein the first-type integrator circuit and the absolute value average detector circuit are together configured to produce a DC component of the switch current configured to flow in the conductor; and at least one second-type switch current sensor subcircuit comprising:

a second coil configured to be coupled to the conductor;

a second-type of integrator circuit having a second-type integrator input and a second integrator output and coupled at the second-type integrator input to the second coil;

a second DC canceling circuit having a second DC canceling input and a second DC canceling output, coupled at the second DC canceling input to the second integrator output, and coupled at the second DC canceling output to the summing circuit, and at least one gain or bandwidth adjustment circuit having an adjustment circuit input and an adjustment circuit output, wherein the second DC canceling output is coupled to the adjustment circuit input and the adjustment circuit output is coupled to the summing circuit, wherein the summing circuit is configured to aggregate the absolute value average output and the second DC canceling output to obtain a voltage waveform that is proportional to the switch current configured to flow in the conductor, the voltage waveform including the DC component and a steady-state alternating current (AC) component of the switch current.

14. The switch current sensor of claim 13, wherein the absolute value average detector circuit is at least one of:

a half-wave rectifier circuit, or a full-wave rectifier circuit.

15. The switch current sensor of claim 13, wherein the at least one second-type switch current sensor subcircuit is a plurality of second-type switch current sensor subcircuits, and each of the plurality of second-type switch current sensor subcircuits is configured to sense a respective portion of a total switch current sensor frequency bandwidth.

* * * * *